(12) United States Patent
Jeong et al.

(10) Patent No.: US 11,018,805 B2
(45) Date of Patent: *May 25, 2021

(54) APPARATUS AND METHOD OF TRANSMISSION USING HARQ IN COMMUNICATION OR BROADCASTING SYSTEM

(71) Applicant: Samsung Electronics Co., Ltd., Suwon-si (KR)

(72) Inventors: Hongsil Jeong, Suwon-si (KR); Kyungjoong Kim, Suwon-si (KR); Sehe Myung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/752,134

(22) Filed: Jan. 24, 2020

(65) Prior Publication Data
US 2020/0162196 A1     May 21, 2020

Related U.S. Application Data

(63) Continuation of application No. 15/933,220, filed on Mar. 22, 2018, now Pat. No. 10,554,337.

(30) Foreign Application Priority Data

Mar. 22, 2017    (KR) ........................ 10-2017-0036021
Apr. 26, 2017    (KR) ........................ 10-2017-0053899
(Continued)

(51) Int. Cl.
*H03M 13/00*     (2006.01)
*H04L 1/00*     (2006.01)
(Continued)

(52) U.S. Cl.
CPC ......... *H04L 1/0058* (2013.01); *H03M 13/116* (2013.01); *H03M 13/1148* (2013.01);
(Continued)

(58) Field of Classification Search
CPC .... G06F 3/0644; G06F 3/0619; G06F 3/0655; G06F 3/0673; G06F 11/1004;
(Continued)

(56) References Cited

U.S. PATENT DOCUMENTS 10,778,366 B2 *   9/2020   Loncke ................. H04L 1/0013
2008/0043703 A1    2/2008   Choi et al.
(Continued)

FOREIGN PATENT DOCUMENTS

KR    10-2008-0017197 A    2/2008

OTHER PUBLICATIONS

International Search Report dated Jun. 21, 2018 in connection with International Patent Application No. PCT/KR2018/003311.
(Continued)

*Primary Examiner* — Christine T. Tu

(57) ABSTRACT

The present disclosure relates to a pre-$5^{th}$-Generation (5G) or 5G communication system to be provided for supporting higher data rates Beyond $4^{th}$-Generation (4G) communication system such as Long Term Evolution (LTE). The present disclosure discloses a method for effective retransmission when HARQ is applied to data encoded with a low density parity check (LDCP) code. A data transmission method of the transmitter may include: initially transmitting data encoded with an LDPC code to a receiver; receiving a negative acknowledgement (NACK) from the receiver; determining retransmission related information for data retransmission; and retransmitting, in response to the NACK, LDPC-encoded data based on the retransmission related information.

16 Claims, 34 Drawing Sheets

(30) Foreign Application Priority Data

Aug. 10, 2017 (KR) .......................... 10-2017-0101937
Sep. 11, 2017 (KR) .......................... 10-2017-0116133
Sep. 29, 2017 (KR) .......................... 10-2017-0128254

(51) Int. Cl.
*H03M 13/11* (2006.01)
*H04L 1/18* (2006.01)

(52) U.S. Cl.
CPC ..... *H03M 13/1185* (2013.01); *H03M 13/616* (2013.01); *H03M 13/6306* (2013.01); *H03M 13/6393* (2013.01); *H04L 1/0041* (2013.01); *H04L 1/0045* (2013.01); *H04L 1/0057* (2013.01); *H04L 1/0067* (2013.01); *H04L 1/1819* (2013.01); *H04L 1/0003* (2013.01); *H04L 1/0009* (2013.01); *H04L 1/0071* (2013.01)

(58) Field of Classification Search
CPC .. G06F 11/1076; H04L 1/0058; H04L 1/0041; H04L 1/0045; H04L 1/0057; H04L 1/0067; H04L 1/1819; H04L 1/0003; H04L 1/0009; H04L 1/0071; H03M 13/116; H03M 13/1185; H03M 13/616; H03M 13/6306; H03M 13/6393
See application file for complete search history.

(56) References Cited

U.S. PATENT DOCUMENTS

| | | |
|---|---|---|
| 2008/0301518 A1 | 12/2008 | Miyazaki |
| 2010/0192037 A1 | 7/2010 | Kuri et al. |
| 2011/0161772 A1 | 6/2011 | Yoshii et al. |
| 2016/0241314 A1 | 8/2016 | Ferrante et al. |
| 2018/0034585 A1 | 2/2018 | Kim et al. |
| 2019/0013901 A1 | 1/2019 | Nimbalker et al. |
| 2019/0132082 A1* | 5/2019 | Ma .................. H03M 13/1185 |
| 2019/0356341 A1* | 11/2019 | Ma .................. H03M 13/1148 |

OTHER PUBLICATIONS

Intel Corporation, "LDPC HARQ design", 3GPP TSG RAN WG1 Ad hoc, Jan. 16-20, 2017, 2 pages, R1-1700384.
Nokia et al., "Multi-bit feedback for NR HARQ operation", 3GPP TSG-RAN WG1 Meeting #88, Feb. 13-17, 2017, 5 pages, R1-1703325.
LG Electronics, "Rate matching design of LDPC code", 3GPP TSG RAN WG1 #88, Feb. 13-17, 2017, 4 pages, R1-1702493.

* cited by examiner

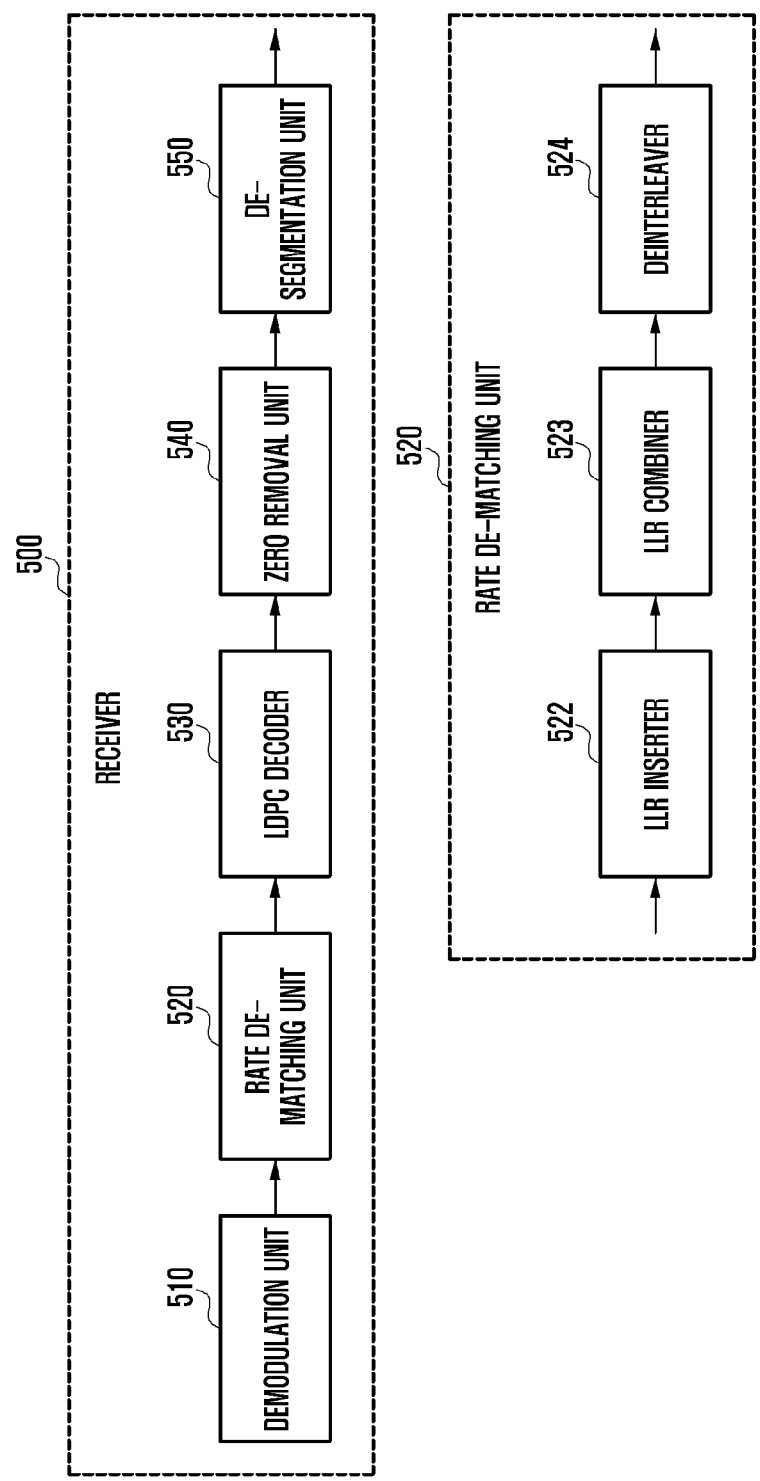

APPARATUS AND METHOD OF TRANSMISSION USING HARQ IN COMMUNICATION OR BROADCASTING SYSTEM

CROSS-REFERENCE TO RELATED APPLICATIONS

This application is a continuation of application Ser. No. 15/933,220, filed Mar. 22, 2018, which claims priority to Korean Patent Application No. 10-2017-0036021, filed Mar. 22, 2017, Korean Patent Application No. 10-2017-0053899, filed Apr. 26, 2017, Korean Patent Application No. 10-2017-0101937, filed Aug. 10, 2017, Korean Patent Application No. 10-2017-0116133, filed Sep. 11, 2017, and Korean Patent Application No. 10-2017-0128254, filed Sep. 29, 2017, the disclosures of which are incorporated herein by reference in their entirety.

BACKGROUND

1. Field

The present disclosure relates to an apparatus and method of transmission using hybrid automatic repeat request (HARQ) in a communication or broadcasting system.

2. Description of Related Art

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In communication or broadcasting systems, the link performance can be significantly degraded by various noise, fading phenomena and inter-symbol interference (ISI). To realize high-speed digital communication or broadcasting systems requiring high data throughput and reliability, such as next generation mobile communication, digital broadcasting, and portable Internet, it is necessary to develop techniques for overcoming noise, fading, and inter-symbol interference. Recently, as part of efforts to overcome noise, research on error correcting codes has been actively carried out to improve the reliability of communication by efficiently restoring information distortion.

SUMMARY

Accordingly, an aspect of the present disclosure is to provide a method and apparatus for low density parity check (LDPC) encoding and decoding that support variable-length codewords from a designed parity check matrix. Another aspect of the present disclosure is to provide a method and apparatus for HARQ transmission based on an LDPC code.

In accordance with an aspect of the present disclosure, there is provided a method of information transmission for a transmitter. The method may include: generating a codeword by performing low density parity check (LDPC) coding on information bits to be transmitted to a receiver based on a parity check matrix selected from among a plurality of parity check matrices; identifying a redundancy version index to be applied to the codeword; and generating a bit sequence to be transmitted to the receiver by performing rate matching on the codeword based on the redundancy version index, wherein a start point of the bit sequence is determined based on the redundancy version index and the selected parity check matrix.

In accordance with an aspect of the present disclosure, there is provided a method of receiving information for a receiver. The method may include: identifying a bit sequence based on a signal received from a transmitter; generating log likelihood ratio (LLR) values based on the identified bit sequence; and outputting information bits by performing low density parity check (LDPC) decoding on the generated LLR values based on a parity check matrix selected from among a plurality of parity check matrices, wherein a start point of the bit sequence is determined based on a redundancy version index and the selected parity check matrix.

In accordance with another aspect of the present disclosure, there is provided a transmitter capable of transmitting information. The transmitter may include: a controller configured to control to: generate a codeword by performing low density parity check (LDPC) coding on information bits to be transmitted to a receiver based on a parity check matrix selected from among a plurality of parity check matrices, identify a redundancy version index to be applied to the codeword, and generate a bit sequence to be transmitted to the receiver by performing rate matching on the codeword based on the redundancy version index, wherein a start point of the bit sequence is determined based on the redundancy version index and the selected parity check matrix.

In accordance with another aspect of the present disclosure, there is provided a receiver capable of receiving information. The receiver may include: a controller configured to control to: identify a bit sequence based on a signal received from a transmitter, generate log likelihood ratio (LLR) values based on the identified bit sequence, and output information bits by performing low density parity check (LDPC) decoding on the generated LLR values based on a parity check matrix selected from among a plurality of parity check matrices, wherein a start point of the bit sequence is determined based on a redundancy version index and the selected parity check matrix.

In a feature of the present disclosure, it is possible to support the HARQ scheme based on an LDPC code applicable to variable lengths and variable rates.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document. Those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 5 illustrates a block diagram of a receiver according to an embodiment of the present disclosure;

DETAILED DESCRIPTION

FIGS. 1 through 25, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, embodiments of the present disclosure are described in detail with reference to the accompanying drawings. Descriptions of well-known functions and structures incorporated herein may be omitted to avoid obscuring the subject matter of the present disclosure. Particular terms may be defined to describe the disclosure in the best manner. Accordingly, the meaning of specific terms or words used in the specification and the claims should be construed in accordance with the spirit of the disclosure.

It should be understood by those skilled in the art that the subject matter of the present disclosure is applicable to other communication systems having similar technical backgrounds without significant modifications departing from the scope of the present disclosure.

The aspects, features and advantages of certain embodiments of the present disclosure will be more apparent from the following detailed description taken in conjunction with the accompanying drawings. The description of the various embodiments is to be construed as examples only and does not describe every possible instance of the present disclosure. It should be apparent to those skilled in the art that the following description of various embodiments of the present disclosure is provided for illustration purpose only and not for the purpose of limiting the present disclosure as defined by the appended claims and their equivalents. The same reference symbols are used throughout the description to refer to the same parts.

The low density parity check (LDPC) code, first introduced by Gallager in the 1960s, has long been forgotten owing to the implementation complexity of the technology at that time. Since turbo codes proposed by Berrou, Glavieux, and Thitimajshima in 1993 show performance close to the channel capacity of Shannon, much research has been done on iterative decoding and graph-based channel coding through many interpretations and analyses on the performance and characteristics of turbo codes. This led to the rediscovery of LDPC codes in the late 1990s. It has been found that when iterative decoding based on a sum-product algorithm is applied on a Tanner graph corresponding to an LDPC code, the LDPC code also has performance close to the channel capacity of Shannon.

In general, an LDPC code is defined by a parity-check matrix and may be represented by a bipartite graph commonly referred to as a Tanner graph.

Figure 1:
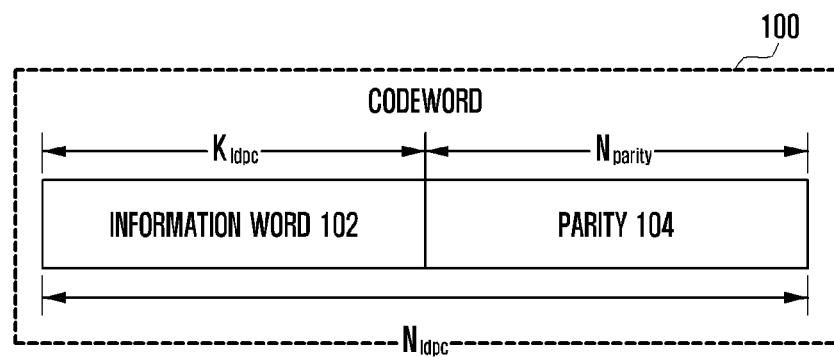
FIG. 1 illustrates the format of a systematic LDPC codeword.

FIG. 1 illustrates the format of a systematic LDPC codeword.

With reference to FIG. 1, LDPC coding receives an information word 102 of $K_{ldpc}$ bits or symbols and generates a codeword 100 of $N_{ldpc}$ bits or symbols. For ease of description, it is assumed that an information word 102 of $K_{ldpc}$ bits is input and a codeword 100 of $N_{ldpc}$ bits is output. That is, a $K_{ldpc}$-bit information word $I=[i_0, i_1, i_2, \ldots, i_{K_{ldpc}-1}]$ 102 is LDPC-coded to generate a codeword $c=[c_0, c_1, c_2, \ldots, c_{N_{ldpc}-1}]$ 100. Here, a codeword is a bit string composed of a plurality of bits, and a codeword bit indicates each bit constituting a codeword. An information word is a bit string composed of a plurality of bits, and an information bit indicates each bit constituting an information word. Particularly, in a systematic code, the codeword is composed of information bits and parity bits ($C=[c_0, c_1, c_2, \ldots, c_{N_{ldpc}-1}]=[i_0, i_1, i_2, \ldots, i_{K_{ldpc}-1}, p_0, p_1, p_2, \ldots p_{N_{ldpc}-K_{ldpc}-1}]$). Here, $P=[p_0, p_1, p_2, \ldots p_{N_{ldpc}-K_{ldpc}-1}]$ is parity bits 104, and the number of parity bits $N_{parity}$ is given by $N_{ldpc}-K_{ldpc}$ ($N_{parity}=N_{ldpc}-K_{ldpc}$).

The LDPC code is a type of linear block code and includes a process of determining codewords satisfying Equation 1 below.

$$H \cdot c^T = [h_1 \ h_2 \ h_3 \ \cdots \ h_{N_{ldpc}-1}] \cdot c^T = \sum_{i=0}^{N_{ldpc}} c_i \cdot h_i = 0 \quad \text{Equation 1}$$

Here, $c=[c_0, c_1, c_2, \ldots p_{N_{ldpc}-1}]$.

In Equation 1, H denotes the parity check matrix, c denotes a codeword, $c_i$ denotes the $i^{th}$ bit of the codeword, $N_{ldpc}$ denotes the codeword length, and $h_i$ denotes the $i^{th}$ column of the parity check matrix H.

The parity check matrix H is composed of $N_{ldpc}$ columns equal to the number of bits in the LDPC codeword. Equation 1 means that the sum of the product of the $i^{th}$ column $h_i$ of the parity check matrix and the $i^{th}$ codeword bit $c_i$ is zero (0), which indicates that the $i^{th}$ column $h_i$ is related to the $i^{th}$ codeword bit $c_i$.

Figure 2:
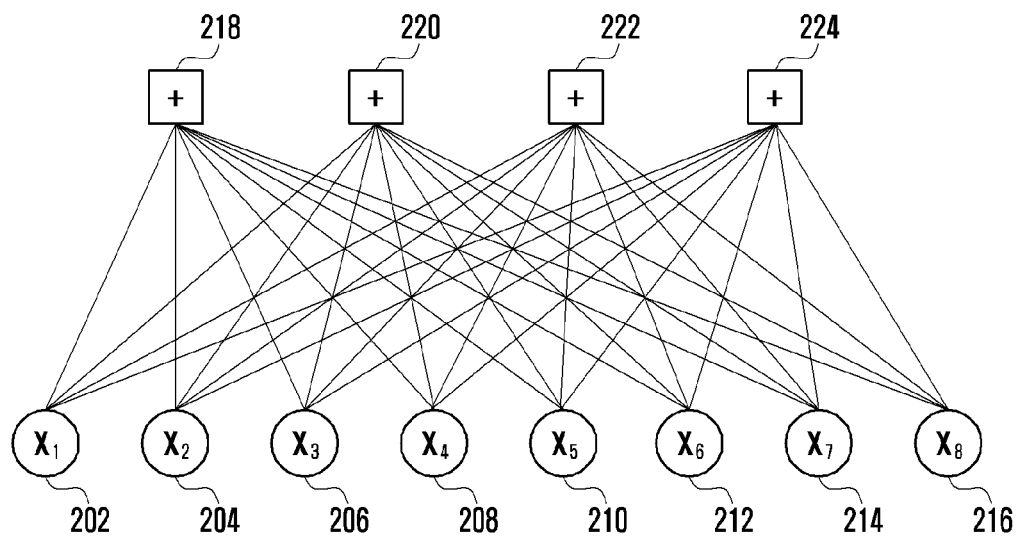
FIG. 2 illustrates a parity check matrix $H_1$ with four rows and eight columns for an LDPC code and a corresponding Tanner graph.

Next, a description is given of a graph representation of an LDPC code with reference to FIG. 2.

FIG. 2 illustrates a parity check matrix H1 with 4 rows and 8 columns for an LDPC code and a corresponding Tanner graph. In FIG. 2, the parity check matrix $H_1$ with 8 columns may generate length-8 codewords. The code generated through $H_1$ is an LDPC code, and each column corresponds to the encoded 8 bits.

In FIG. 2, the Tanner graph of the LDPC code for encoding and decoding based on the parity check matrix $H_1$ includes eight variable nodes $x_1(202), x_2(204), x_3(206), x_4(208), x_5(210), x_6(212), x_7(214)$ and $x_8(216)$ and four check nodes (218, 220, 222 and 224). Here, the $i^{th}$ column and the $i^{th}$ row of the parity check matrix $H_1$ correspond respectively to the variable node $x_i$ and the $j^{th}$ check node. The variable node $x_i$ is connected to the $j^{th}$ check node (an edge exists between variable node $x_i$ and $j^{th}$ check node) on the Tanner graph if the element $h_{ji}$ of $H_1$ is a 1 (non-zero).

The degree of a variable node or a check node in the Tanner graph indicates the number of edges incident to the node, and is equal to the number of non-zero entries in the column or row corresponding to the node in the parity check matrix. For example, in FIG. 2, the degrees of the variable nodes $x_1(202), x_2(204), x_3(206), x_4(208), x_5(210), x_6(212), x_7(214), x_8(216)$ are 4, 3, 3, 3, 2, 2, 2 and 2, respectively; and the degrees of the check nodes 218, 220, 222 and 224 is 6, 5, 5 and 5, respectively. For the columns of the parity check matrix $H_1$ corresponding to the variable nodes, the number of non-zero elements is identical to the node degree of 4, 3, 3, 3, 2, 2 or 2, respectively; and for the rows of the parity check matrix $H_1$ corresponding to the check nodes, the number of non-zero elements is identical to the node degree of 6, 5, 5 or 5, respectively.

The LDPC code can be decoded using an iterative scheme based on a sum-product algorithm on the bipartite graph as shown in FIG. 2. The sum-product algorithm is a type of message passing algorithm. The message passing algorithm refers to an algorithm that exchanges messages via edges on a bipartite graph, calculates output messages from messages input to the variable nodes or check nodes, and updates information.

Here, the value of the $i^{th}$ codeword bit can be determined based on the message of the $i^{th}$ variable node. The value of the $i^{th}$ codeword bit can be obtained through a hard decision or a soft decision. Hence, the performance of the $i^{th}$ bit $c_i$ of the LDPC codeword corresponds to the performance of the $i^{th}$ variable node of the Tanner graph, which can be determined according to the positions and the number of 1's in the $i^{th}$ column of the parity check matrix. In other words, the performance of the $N_{ldpc}$ bits of the codeword may depend on the positions and the number of 1's of the parity check matrix, which means that the performance of the LDPC code is greatly affected by the parity check matrix. Therefore, a good parity check matrix design method is used to design LDPC codes with high performance.

In communication and broadcasting systems, quasi-cyclic LDPC (QC-LDPC) codes using a quasi-cyclic parity check matrix are frequently used for ease of implementation.

The QC-LDPC code is characterized by having a parity check matrix composed of a zero matrix or a circulant permutation matrix in the form of a small square matrix.

A more detailed description is given of the QC-LDPC code with reference to the following document [Myung2006], which is incorporated herein by reference.

Reference [Myung2006]

S. Myung, K. Yang, and Y. Kim, "Lifting Methods for Quasi-Cyclic LDPC Codes," IEEE Communications Letters. vol. 10, pp. 489-491, June 2006.

According to reference [Myung2006], a permutation matrix $P=(P_{i,j})$ of size L×L is defined using Equation 2 below. Here, $P_{ij}$ denotes the entry of the $i^{th}$ row and $j^{th}$ column in the matrix P (0≤i, j<L).

$$P_{i,j} = \begin{cases} 1 & \text{if } i+1 \equiv j \bmod L \\ 0 & \text{otherwise} \end{cases} \quad \text{Equation 2}$$

For the permutation matrix P, it can be seen that the permutation matrix $P^i$ (0≤i<L) is a circulant permutation matrix obtained by circularly shifting all entries of the identity matrix of size L×L times to the right.

The parity check matrix H for the simplest QC-LDPC code can be represented by Equation 3 below.

$$H = \begin{bmatrix} P^{a_{11}} & P^{a_{12}} & \cdots & P^{a_{1n}} \\ P^{a_{21}} & P^{a_{22}} & \cdots & P^{a_{2n}} \\ \vdots & \vdots & \ddots & \vdots \\ P^{a_{m1}} & P^{a_{m2}} & \cdots & P^{a_{mn}} \end{bmatrix} \quad \text{Equation 3}$$

In Equation 3, when the zero matrix of size L×L is denoted by $P^{-1}$, the exponent $a_{i,j}$ of the circulant permutation matrix or zero matrix is set to one of $\{-1, 0, 1, 2, \ldots, L-1\}$. As the parity check matrix H includes n column blocks and m row blocks, it has a size mL×nL. In addition, the size of the circulant permutation matrix may be represented by Z×Z.

A binary matrix having a size m×n obtained by replacing each circulant permutation matrix and zero matrix by 1 and 0 respectively in the parity check matrix of Equation 3 is referred to as the mother matrix M(H) of the parity check matrix H. As shown in Equation 4, an integer matrix of size m×n obtained by extracting the exponent of each circulant permutation matrix or zero matrix is referred to as the exponent matrix E(H) of the parity check matrix H.

$$E(H) = \begin{bmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{bmatrix} \quad \text{Equation 4}$$

Meanwhile, the performance of the LDPC code can be determined according to the parity check matrix. Hence, it is necessary to design a parity check matrix for an LDPC code with high performance. Also, there is a need for an LDPC coding and decoding method supporting various input lengths and code rates.

According to reference [Myung2006], a method known as lifting is used for efficient design of the QC-LDPC code. Lifting is a method of efficiently designing a very large parity check matrix by setting the L value, which determines the size of the circulant permutation matrix or zero matrix from a given small mother matrix, according to a specific rule. The existing lifting method and characteristics of the QC-LDPC code designed through lifting are briefly summarized as follows.

When LDPC code $C_0$ is given, the S QC-LDPC codes to be designed through lifting are referred to as $C_1, \ldots Cs$, and the size of the row block and the column block of the parity check matrix of each QC-LDPC code is referred to as $L_k$. Here, $C_0$ corresponds to the smallest LDPC code having the mother matrix of the codes $C_1, \ldots, C_S$ as the parity check matrix, and $L_0$ corresponding to the size of the row block and the column block is 1. For convenience, the parity check matrix $H_k$ of each code $C_k$ has an exponent matrix $E(H_k) = (e_{i,j}^{(k)})$ of size m×n, and each exponent $e_{i,j}^{(k)}$ is set to one of $\{-1, 0, 1, 2, \ldots, L_k-1\}$.

In reference [Myung2006], lifting is performed in steps of $C_0 \to C_1 \to \ldots \to Cs$, and has a feature of $L_{k+1} = q_{k+1} L_k$ ($q_{k+1}$ is a positive integer with k=0, 1, ..., S−1) Also, if only the parity check matrix $H_s$ of Cs is stored, the QC-LDPC codes $C_0, C_1, \ldots, Cs$ can be represented by using Equation 5 according to the characteristics of the lifting process.

$$E(H_k) \equiv \left\lfloor \frac{L_k}{L_S} E(H_S) \right\rfloor \quad \text{Equation 5}$$

$$E(H_k) \equiv E(H_S) \bmod L_k \quad \text{Equation 6}$$

In lifting according to Equation 5 or Equation 6, the values of $L_k$ corresponding to the size of the row block or column block in the parity check matrices of the QC-LDPC codes $C_k$ have a relationship of multiples, and the exponent matrices are also selected according to a particular scheme. Such an existing lifting scheme may improve the algebraic or graph characteristics of the parity check matrixes designed through lifting and make it possible to easily design QC-LDPC codes having improved error floor characteristics.

However, since the values of $L_k$ are in a multiple relationship with each other, the length of the code is significantly limited. For example, when minimum lifting such as $L_{k+1} = 2 \times L_k$ is applied for each $L_k$, the parity check matrix of each QC-LDPC code may have a size of $2_m^k \times 2_n^k$ only. That is, when lifting is applied in 10 steps (S=10), the parity check matrix can have only 10 sizes.

For this reason, existing lifting schemes are somewhat disadvantageous in designing QC-LDPC codes supporting various lengths. In commonly used mobile communication systems, a very high level of length compatibility is used in consideration of various types of data transmission. Hence, it may be difficult to apply the LDPC code to the mobile communication system in a conventional manner.

The S QC-LDPC codes to be designed through lifting are referred to as $C_1, \ldots, Cs$, and the size of the row block and the column block of the parity check matrix of the QC-LDPC code $C_i$ is referred to as Z. For convenience, the parity check matrix $H_Z$ of each code $C_i$ has an exponent matrix $E(H_Z) = (e_{i,j}^{(Z)})$ of size m×n, and each exponent $e_{i,j}^{(Z)}$ is set to one of $\{-1, 0, 1, 2, \ldots, L_k-1\}$. (Although the exponent of the zero matrix is set to −1 for convenience in the present disclosure, it can be set to a different value depending on the system.)

The exponent matrix of the LDPC code Cs having the largest parity check matrix is referred to as $E(H_{Z_{max}})$ ($Z_{max}$ Z is the maximum among Z values). In this case, for Z less than $Z_{max}$, the exponent representing the circulant permutation matrix and zero matrix constituting the parity check matrix of each LDPC code may be determined according to Equation 7 or Equation 8.

$$e_{i,j}^{(Z)} = \begin{cases} e_{i,j}^{(Z_{max})} & \text{if } e_{i,j}^{(Z_{max})} \leq 0 \\ \mod(e_{i,j}^{(Z_{max})}, Z) & \text{if } e_{i,j}^{(Z_{max})} > 0 \end{cases} \quad \text{Equation 7}$$

$$e_{i,j}^{(Z)} = \begin{cases} e_{i,j}^{(Z_{max})} & \text{if } e_{i,j}^{(Z_{max})} < 0 \\ \mod(e_{i,j}^{(Z_{max})}, Z) & \text{if } e_{i,j}^{(Z_{max})} \geq 0 \end{cases} \quad \text{Equation 8}$$

In Equation 7 or 8, mod $(e_{i,j}^{(Z_{max})}, Z)$ represents the remainder obtained by dividing $e_{i,j}^{(Z_{max})}$ by Z.

However, as the values of Z are limited to satisfy a multiple relationship among them in reference [Myung2006], it is not suitable for supporting various lengths. For example, when the number n of columns of the exponent matrix $E(H_Z)$ or mother matrix $M(H_Z)$ of the parity check matrix $H_Z$ is 36 and the values of Z are limited to 1, 2, 4, 8, . . . , 128, the lengths that can be obtained through 8-stage lifting are 36, 72, 144, . . . , 4608(=36×2$^7$), in which case the difference between the smallest length and the largest length becomes very large.

The present disclosure proposes a method of designing a parity check matrix to which exponent conversion shown in Equation 7 or 8 can be applied without any degradation in performance even when the values of Z are not in a multiple relationship. For reference, Equation 7 or 8 illustrates exponent conversion when lifting based on modulo operation is applied. As shown in reference [Myung2006], exponent conversion may also be performed based on various other schemes such as flooring operation. Next, Equation 9 or Equation 10 represents exponent conversion for a parity check matrix designed by applying lifting based on flooring operation when Z is less than $Z_{max}$.

$$e_{i,j}^{(Z)} = \begin{cases} e_{i,j}^{(Z_{max})} & \text{if } e_{i,j}^{(Z_{max})} \leq 0 \\ \left\lfloor \frac{Z}{Z_{max}} e_{i,j}^{(Z_{max})} \right\rfloor & \text{if } e_{i,j}^{(Z_{max})} > 0 \end{cases} \quad \text{Equation 9}$$

$$e_{i,j}^{(Z)} = \begin{cases} e_{i,j}^{(Z_{max})} & \text{if } e_{i,j}^{(Z_{max})} < 0 \\ \left\lfloor \frac{Z}{Z_{max}} e_{i,j}^{(Z_{max})} \right\rfloor & \text{if } e_{i,j}^{(Z_{max})} \geq 0 \end{cases} \quad \text{Equation 10}$$

Next, to solve the length compatibility problem of the existing lifting method, a description is given of a method of designing and using a parity check matrix.

In the present disclosure, the modified lifting process is defined as follows.

1) The maximum of Z values is referred to as $Z_{max}$.

2) One of the divisors of $H_Z$ is referred to as $D(Z_{max})=D\cdot S$.

3) Z is one of D, 2D, 3D, . . . , and SD (=$Z_{max}$).

(For convenience, the parity check matrix corresponding to z=k×D is referred to as $H_k$, and the LDPC code corresponding to this parity check matrix is referred to as $C_k$).

In addition to the above-mentioned lifting method, various other lifting methods can be used to support variable lengths.

Next, a more detailed description is given of an encoding method for the QC-LDPC code with reference to the following document [Myung2005], which is incorporated herein by reference.

Reference [Myung2005]

S. Myung, K. Yang, and J. Kim, "Quasi-Cyclic LDPC Codes for Fast Encoding," IEEE Transactions on Information Theory, vol. 51, No. 8, pp. 2894-2901, August 2005.

Figure 3:
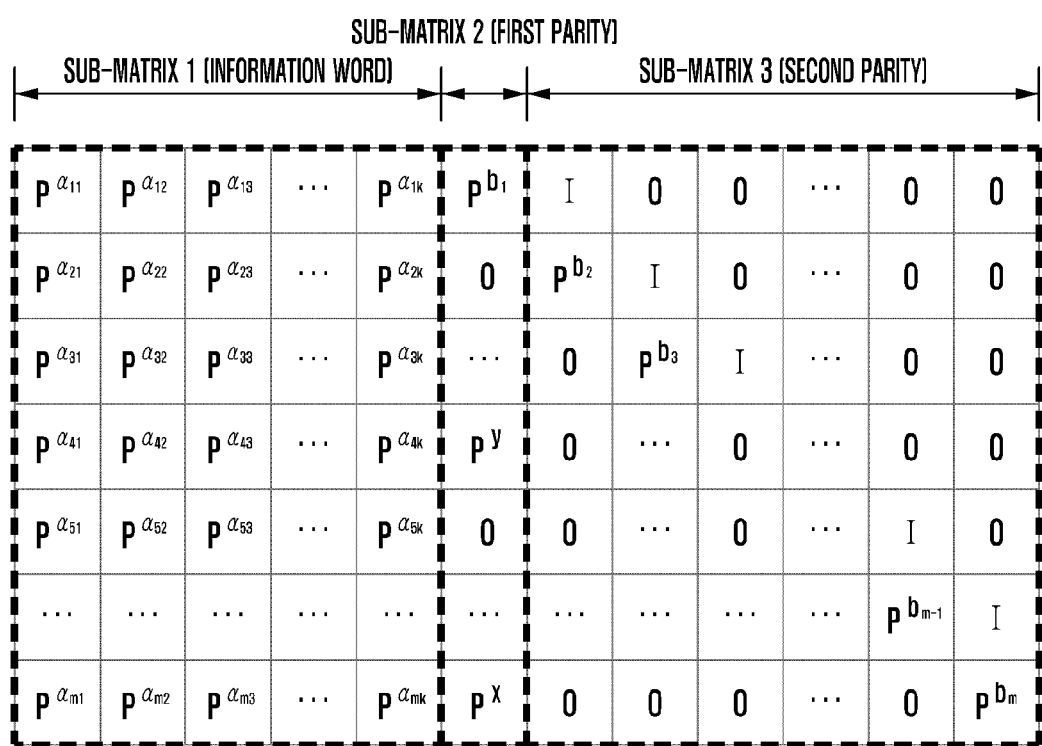
FIG. 3 shows a basic layout of the parity check matrix.

FIG. 3 shows a basic layout of the parity check matrix proposed in the present disclosure.

In reference [Myung2005], a special parity check matrix composed of a circulant permutation matrix is defined as shown in FIG. 3. Also, it is shown that efficient coding can be achieved if the relation given by Equation 11 or 12 is satisfied in the parity check matrix of FIG. 3.

$$x \equiv \sum_{i=1}^{m} b_i \mod Z \text{ and } y \equiv -\sum_{i=l+1}^{m} b_i \mod Z \quad \text{Equation 11}$$

$$\sum_{i=1}^{m} b_i \equiv 0 \mod Z \text{ and } x \equiv y + \sum_{i=l+1}^{m} b_i \mod Z \quad \text{Equation 12}$$

In Equation 11 and Equation 12, $l(\neq 1, m)$ indicates the position of the row in which $p^y$ is located.

If Equation 7 and Equation 8 are satisfied as described above, it is well known that the matrix defined by $\varphi$ in reference [Myung2005] becomes an identity matrix and efficient coding can be performed in the encoding process.

In the above description, a case where only one circulant permutation matrix corresponds to one block has been described for convenience. However, the present disclosure can be applied to a case where a plurality of circulant permutation matrixes are included in one block.

Figure 4:
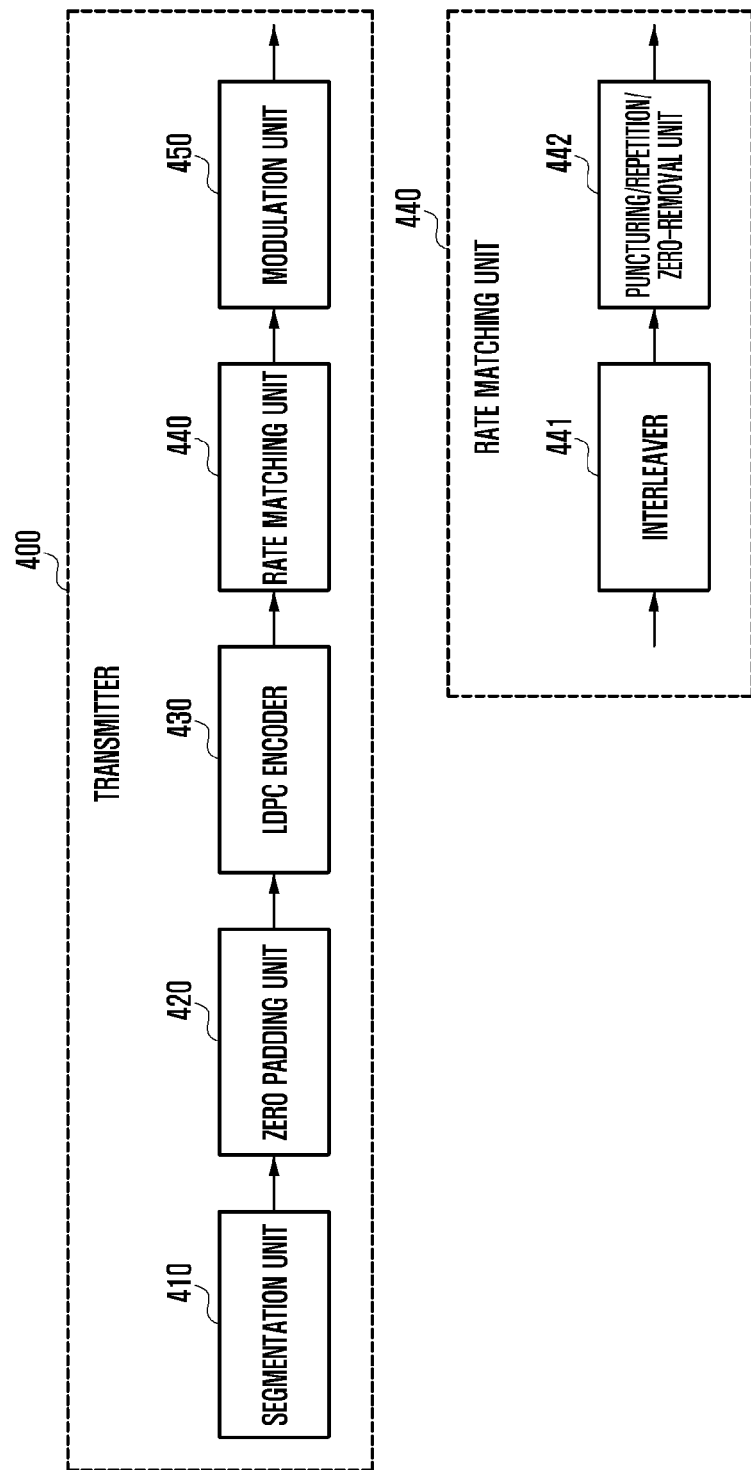
FIG. 4 illustrates a block diagram of a transmitter according to an embodiment of the present disclosure.

FIG. 4 illustrates a block diagram of a transmitter according to an embodiment of the present disclosure.

As shown in FIG. 4, to process variable length input bits, the transmitter 400 may include a segmentation unit 410, a zero padding unit 420, an LDPC encoder 430, a rate matching unit 440, and a modulation unit 450.

The components shown in FIG. 4 are components that perform encoding and modulation on variable length input bits. This is an example only. In some cases, some of the components shown in FIG. 4 may be omitted or changed, and other components may be added.

FIG. 5 illustrates a block diagram of a receiver according to an embodiment of the present disclosure.

As shown in FIG. 5, to process variable length information, the receiver 500 may include a demodulation unit 510, a rate de-matching unit 520, an LDPC decoder 530, a zero removal unit 540, and a de-segmentation unit 550.

The components shown in FIG. 5 are components that perform the functions corresponding to the components shown in FIG. 4. This is an example only. In some cases, some of the components shown in FIG. 5 may be omitted or changed, and other components may be added.

Figure 6A:
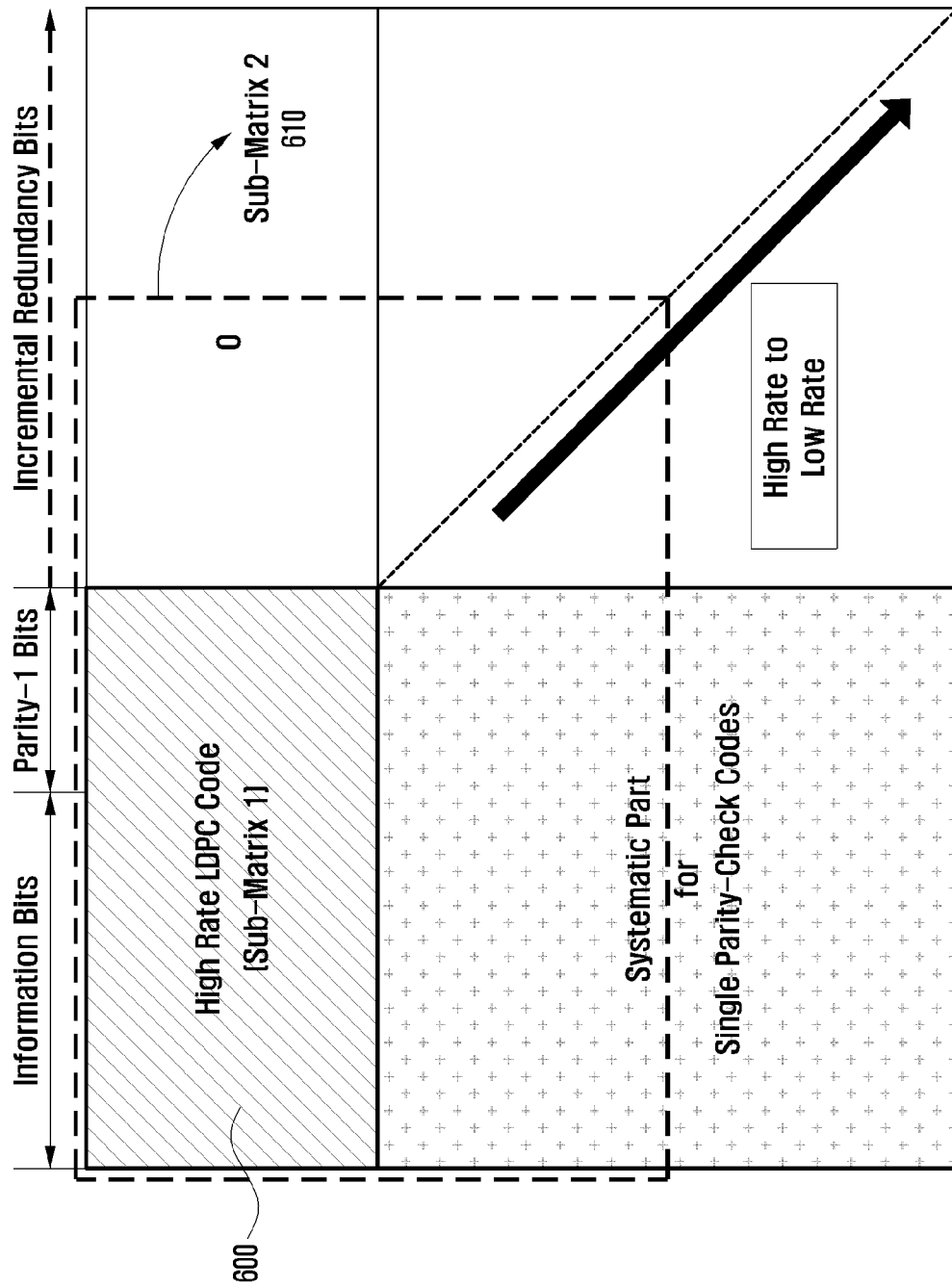
FIGS. 6A and 6B illustrate the characteristics of an LDPC parity check matrix used in the present disclosure.
Figure 6B:
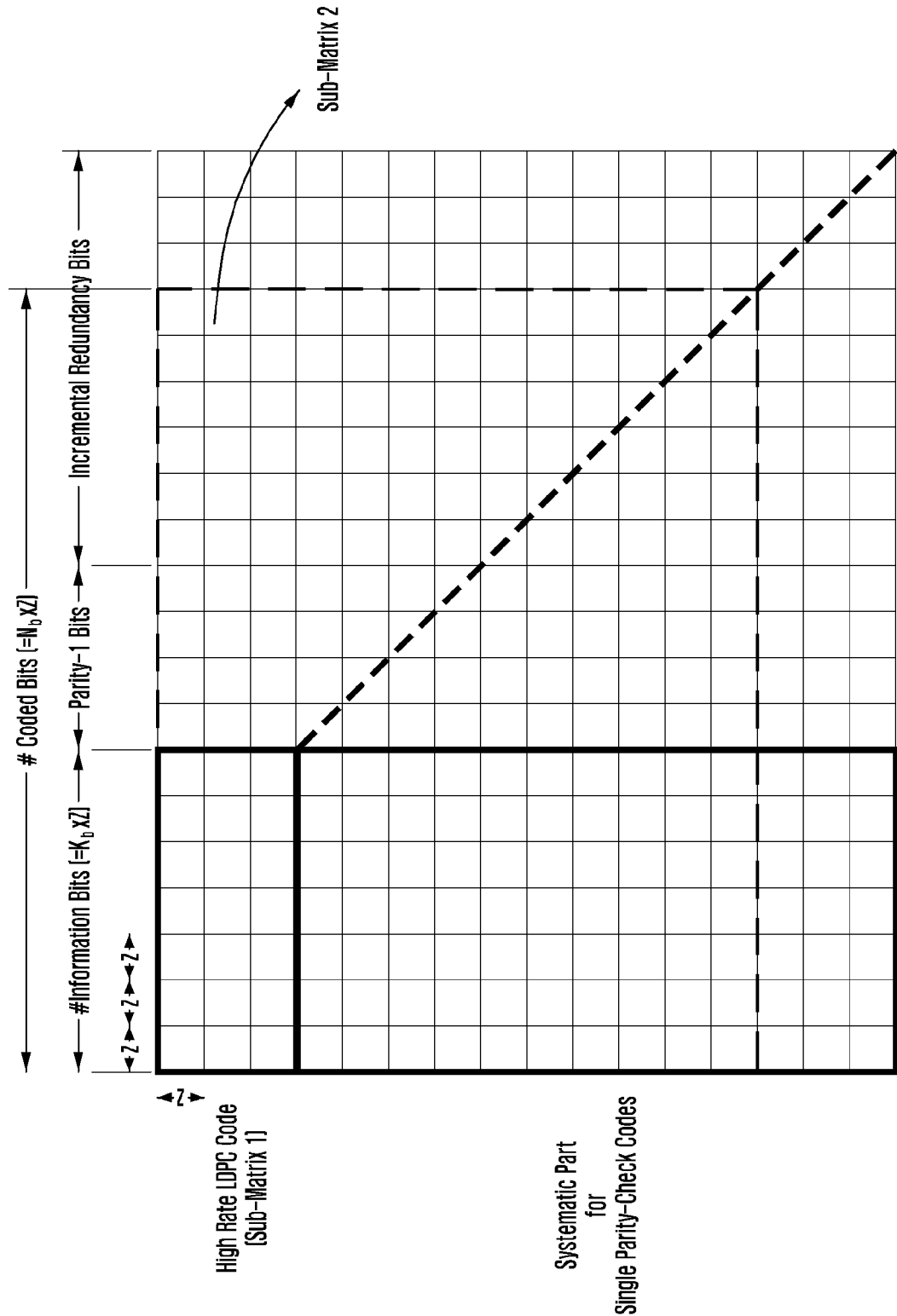

FIGS. 6A and 6B illustrate the characteristics of an LDPC parity check matrix used in the present disclosure.

FIGS. 6A and 6B show examples of a parity check matrix designed for the hybrid automatic repeat request (HARQ) scheme based on various code rates and incremental redundancy (IR). In FIGS. 6A and 6B, the order of the parity check matrix corresponding to the incremental redundancy bits is one. The column blocks with order of 1 are composed of a circulant permutation matrix and a zero matrix. Due to the form of the parity check matrix, the incremental redundancy bits are generated as single parity check extension. The incremental redundancy bits may also be sent in the initial transmission.

With reference to FIG. 6A, the size of the LDPC parity check matrix used in the present disclosure may vary depending on the code rate. For example, when a high code rate is applied, the parity check matrix corresponds to sub-matrix 1 (600), which includes information bits and parity-1 bits. When a lower code rate is applied, the parity check matrix corresponds to sub-matrix 2 (610), which includes the systematic part for the IR bits and the single parity check code as well as the part contained in sub-matrix 1. The IR bits and the systematic part included in the parity check matrix become larger as the code rate becomes lower.

In FIG. 6B, which is a more detailed version of FIG. 6A, the part for the information bits of the parity check matrix is composed of $K_b$ column blocks. Sub-matrix 2 is composed of $N_b$ column blocks. In this case, the length of the codeword is $N_b \times Z$.

The parity check matrix including a concatenation with the single parity check code has good extendibility and is suitable for the incremental redundancy (IR) technique. As the IR technique is important for supporting HARQ, an efficient and high-performance IR technique can increase the efficiency of the HARQ system. The LDPC codes based on the parity check matrices can be applied to an efficient and high-performance IR technique by generating and transmitting new parities using the part extended by the single parity check code.

For reference, it is evident that LDPC coding supporting various block lengths and coding rates can be utilized if shortening and puncturing are appropriately applied to the LDPC code corresponding to the parity check matrix described herein. In other words, it is possible to support various information word lengths by applying appropriate shortening to the LDPC code corresponding to the parity check matrix; it is possible to support various code rates by appropriately applying puncturing; and it is possible to apply an efficient IR technique by generating and transmitting single parity check bits of appropriate length.

The LDPC code can be decoded using an iterative scheme based on a sum-product algorithm on the bipartite graph as shown in FIG. 2. The sum-product algorithm is a type of message passing algorithm.

Figure 7A:
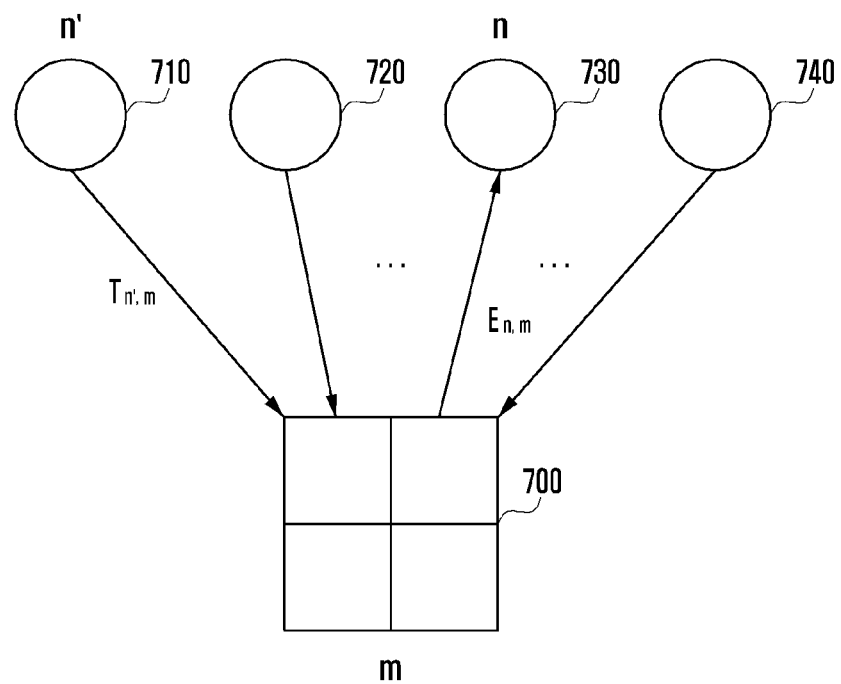
FIGS. 7A and 7B illustrate message passing operations performed by check and variable nodes for LDPC decoding.
Figure 7B:
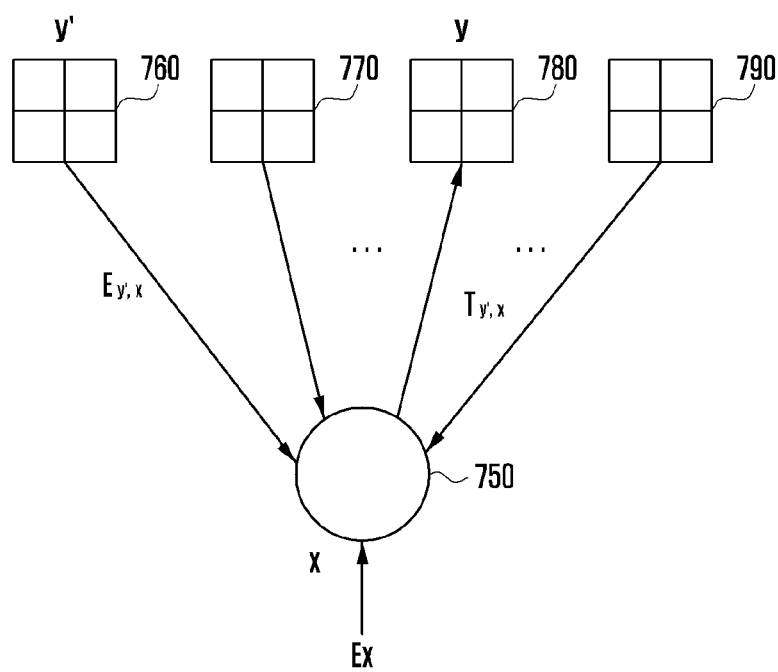

Next, a description is given of message passing operations commonly used in LDPC decoding with reference to FIGS. 7A and 7B.

FIGS. 7A and 7B illustrate message passing operations performed by check and variable nodes for LDPC decoding.

In FIG. 7A, there are a check node m (700) and a plurality of variable nodes (710, 720, 730, and 740) connected to the check node m (700). $T_{n',m}$ indicates a message passed from the variable node n' (710) to the check node m (700), and $E_{n,m}$ indicates a message passed from the check node m (700) to the variable node n (730). Here, let N(m) be the set of all variable nodes connected to the check node m (700), and let N(m)\n be the set obtained by excluding the variable node n (730) from N(m).

In this case, the message update rule based on the sum-product algorithm can be represented by Equation 13 below.

$$|E_{n,m}| = \Phi\left[\sum_{n' \in N(m)\backslash n} \Phi(|T_{n',m}|)\right] \quad \text{Equation 13}$$

-continued $$\text{Sign}(E_{n,m}) = \prod_{n' \in N(m)\backslash n} \text{sign}(T_{n',m})$$

Here, sign $E_{n,m}$ indicates the sign of message $E_{n,m}$, and $|E_{n,m}|$ indicates the magnitude of message $E_{n,m}$. The function $\Phi(x)$ can be represented by Equation 14 below.

$$\Phi(x) = -\log\left(\tanh\left(\frac{x}{2}\right)\right) \quad \text{Equation 14}$$

In FIG. 7B, there are a variable node X (750) and a plurality of check nodes (760, 770, 780 and 790) connected to the variable node x (750). $E_{y',x}$ indicates a message passed from the check node y' (760) to the variable node X (750), and $T_{y,x}$ indicates a message passed from the variable node x (750) to the variable node y (780). Here, let M(x) be the set of all check nodes connected to the variable node X (750), and let M(x)\y be the set obtained by excluding the check node y (780) from M(x). In this case, the message update rule based on the sum-product algorithm can be represented by Equation 15 below.

$$T_{y,x} = E_x + \sum_{y' \in M(x)\backslash y} E_{y',x} \quad \text{Equation 15}$$

Here, $E_x$ denotes the initial message value of the variable node x.

To determine the bit value of the node x, Equation 16 below can be used.

$$P_x = E_x + \sum_{y' \in M(x)} E_{y',x} \quad \text{Equation 16}$$

In this case, the encoding bit corresponding to the node x can be determined according to the $P_x$ value.

As the scheme illustrated in FIGS. 7A and 7B is a general decoding scheme, a detailed description thereof will be omitted. In addition to the scheme described in FIGS. 7A and 7B, other schemes may be applied to determine message values passed at variable nodes and check nodes. For example, see Frank R. Kschischang, Brendan J. Frey, and Hans-Andrea Loeliger, "Factor Graphs and the Sum-Product Algorithm," IEEE TRANSACTIONS ON INFORMATION THEORY, VOL. 47, NO. 2, FEBRUARY 2001, pp 498-519, incorporated herein by reference.

Next, a detailed description is given of the operation of the transmitter with reference to FIG. 4.

As shown in FIG. 4, to process variable length input bits, the transmitter 400 may include a segmentation unit 410, a zero padding unit 420, an LDPC encoder 430, a rate matching unit 440, and a modulation unit 450.

The components shown in FIG. 4 are components that perform encoding and modulation on variable length input bits. This is an example only. In some cases, some of the components shown in FIG. 4 may be omitted or changed, and other components may be added.

Figure 8:
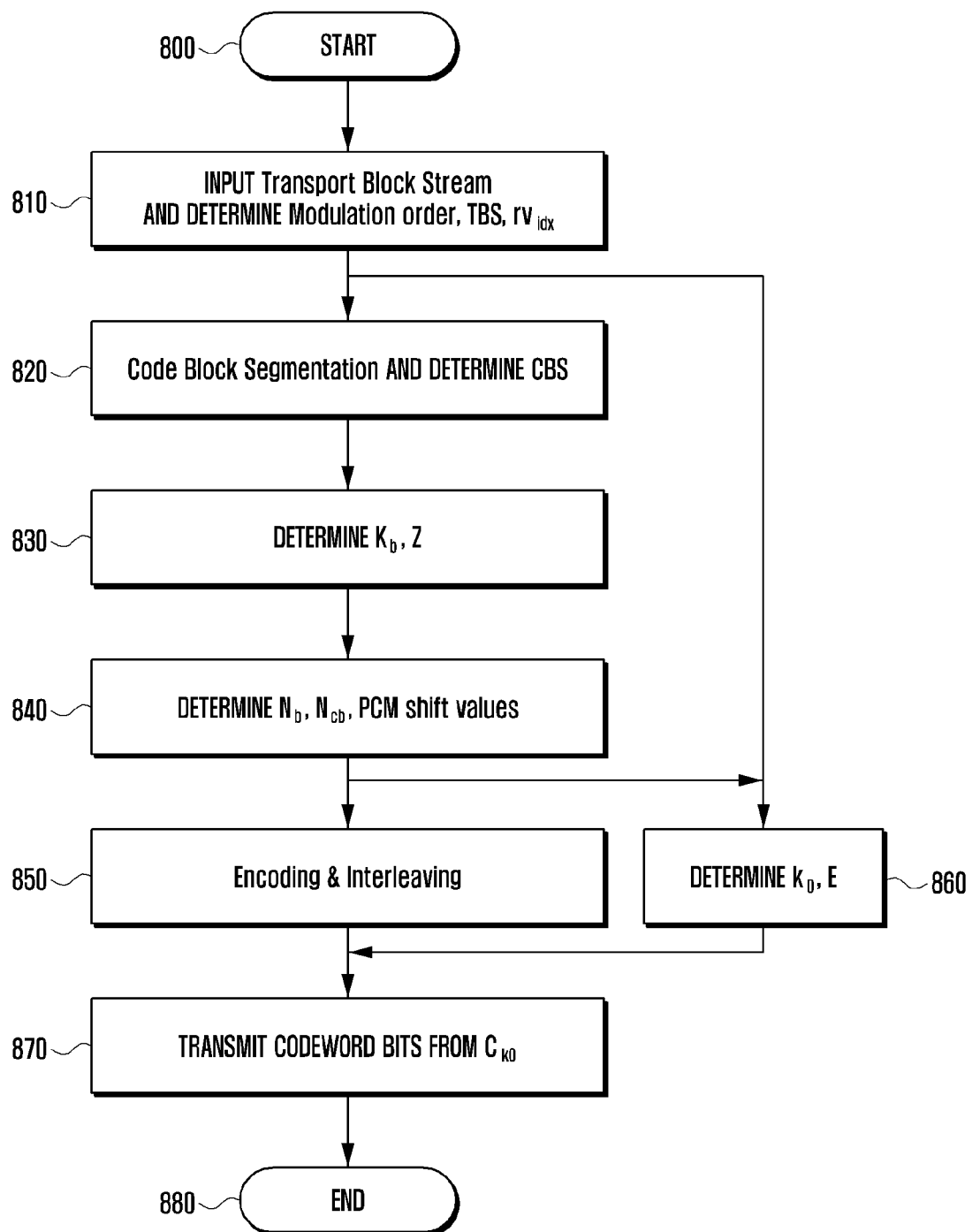
FIG. 8 illustrates a flowchart of a transmission method according to an embodiment of the present disclosure.

The LDPC encoder 430 shown in FIG. 4 can perform the operations performed by the LDPC encoder described in FIG. 8.

Meanwhile, the transmitter 400 may determine needed parameters (e.g., input bit length, modulation and code rate (ModCod), zero padding parameter, LDPC code rate/length, interleaving parameter, repetition parameter, puncturing parameter, retransmission parameter, and modulation scheme), perform encoding based on the determined parameters, and perform transmission to the receiver 500 shown in FIG. 5.

As the number of input bits is variable, when the number of input bits is greater than a preset threshold, the input bits may be segmented into blocks whose length is less than or equal to the threshold. Each segmented block may correspond to one LDPC coded block. When the number of input bits is less than or equal to the threshold, the input bits are not segmented, and the input bits may correspond to one LDPC coded block.

By making the lengths of the segmented code blocks equal, the LDPC coding and decoding parameters for the code blocks can be made identical, lowering the implementation complexity. In addition, by making the padded zeros of the code blocks as equal as possible, the coding performance can be improved.

The input bits of the rate matching unit 440 are the output bits of the LDPC encoder 430 and may be given by $C=(i_0, i_1, i_2, \ldots, i_{Kldpc-1}, p_0, p_1, p_2, \ldots, p_{Nldpc-Kldpc-1})$. Here, $i_k$ ($0 \leq k < K_{ldpc}$) indicates input bits of the LDPC encoder 430, and $p_k$ ($0 \leq k < N_{ldpc} - K_{ldpc}$) indicates LDPC parity bits. The rate matching unit 440 may include an interleaver 441 and a puncturing/repetition/zero-removal unit 442

The modulation unit 450 modulates the bit stream output from the rate matching unit 440 and transmits the modulated bit stream to the receiver (e.g., receiver 500 in FIG. 5).

Specifically, the modulation unit 450 demultiplexes the bits output from the rate matching unit 440 and maps the demultiplexed bits to the constellation.

That is, the modulation unit 450 may apply serial-to-parallel conversion to the bits output from the rate matching unit 440 to generate cells having a preset number of bits. Here, the number of bits constituting each cell may equal the number of bits constituting the modulation symbol mapped to the constellation.

Thereafter, the modulation unit 450 may map the demultiplexed bits to the constellation. That is, the modulation unit 450 may modulate the demultiplexed bits through various modulation schemes such as QPSK, 16-QAM, 64-QAM, 256-QAM, 1024-QAM, and 4096-QAM to generate modulation symbols, and map the modulation symbols to the constellation points. In this case, since the demultiplexed bits constitute cells containing as many bits as the number of modulation symbols, the cells can be mapped in sequence to the constellation points.

Thereafter, the modulation unit 450 may modulate the signal mapped to the constellation and transmit the modulated signal to the receiver 500. For example, the modulation unit 450 may use orthogonal frequency division multiplexing (OFDM) to map the signal mapped to the constellation to OFDM frames and transmit the mapped signal to the receiver 500 through the allocated channel.

Meanwhile, the transmitter 400 may pre-store various parameters for coding, interleaving, and modulation. Here, the parameters for coding may include the code rate of the LDPC code, the codeword length, and information on the parity check matrix. The parameters for interleaving may include information on the interleaving rule, and the parameters for modulation may include information on the modulation schemes. The information about puncturing may include the puncturing length. The information about repetition may include the repetition length. The information on the parity check matrix may include the exponent values of the permutation matrix according to Equations 3 and 4 when the parity matrix proposed in the present disclosure is used.

In this case, each component constituting the transmitter 400 can perform an operation using these parameters.

Although not shown, the transmitter 400 may further include a controller to control the operation thereof if necessary.

In the present disclosure, to support hybrid automatic repeat request (HARQ) based on the LDPC code, the rate matching method and apparatus will be described.

FIG. 8 illustrates a flowchart describing transmitter operation according to the present disclosure. Next, a description is given of the transmission method based on the LDPC code with reference to FIG. 8.

At step 810, the transmitter may determine the modulation order of modulation symbols, transport block size (TBS), and redundancy version or redundancy version index ($rv_{idx}$) for transmission. These values may be transmitted as control information and may be determined according to a preset rule based on the related parameters. The redundancy version index ($rv_{idx}$) is an integer less than a preset maximum and serves as an index to the redundancy version, and it is a parameter for determining the position of the transmission start bit. The number of $rv_{idx}$ values may be different depending on the system, and $rv_{idx}$ may have four values of 0, 1, 2, or 3 in the LTE standards. The transmitter may determine $rv_{idx}$ and notify it to the receiver at the time of each transmission. Alternatively, the receiver may determine $rv_{idx}$ and notify it to the transmitter, and the transmitter may use the determined value of $rv_{idx}$. The value of $rv_{idx}$ may be determined according to a preset order and the number of retransmissions. In the uplink retransmission of the LTE system, the value of $rv_{idx}$ is determined in the order of 0, 2, 3 and 1, and is updated by the modulo 4 operation. The modulation order and $rv_{idx}$ may be determined at step 860.

At step 820, the transmitter may segment transport blocks (TB) into code blocks (CB) based on the determined TBS value. During this segmentation, the code block size (CBS) is determined. At step 830, based on the determined CBS and parameters for the parity check matrix of the LDPC code, the transmitter may determine the value of $K_b$ (the number of column blocks of the information-word part of the parity check matrix), and the value of Z (the size of the circulant permutation matrix or zero matrix constituting the QC-LDPC code). At step 840, the transmitter may determine the value of $N_b$ (the number of column blocks of the parity check matrix (PCM) in consideration of retransmission), the exponent shift values of the circulant permutation matrixes of the parity check matrix, and the value of $N_{cb}$ (the number of codeword bits in consideration of retransmission). The value of $N_{cb}$ may be identical to $N_b \times Z$, may be set to a value different from $N_b \times Z$ according to a preset rule, and may be determined after step 840. The value of $N_b$ may change according to the value of CBS. The maximum number of column blocks of the parity check matrix of the LDPC code is set to $N_{b\_max}$ and $N_b$ is less than or equal to $N_{b\_max}$.

The value of $N_cb$ may differ depending on the maximum value of $rv_{idx}$. The range of $rv_{idx}$ (the number of values and the maximum value) may be changed according to at least one of the code rate, UE category, parity check matrix, uplink or downlink, and information word length, and the number of actually encoded bits may be different accordingly. The value of $N_{cb}$ may be changed according to at least one of the code rate, UE category, parity check matrix, uplink or downlink, and information word length regardless of the range of $rv_{idx}$.

In one embodiment, at step 850, the transmitter may perform LDPC coding and interleaving based on the determined parameters. Interleaving may be performed only when necessary. There may be a plurality of parity check matrices usable for LDPC coding, and the parity check matrix used for encoding may be determined according to a preset rule. The size of the parity check matrix used in LDPC coding may be different depending upon the value of $rv_{idx}$ and code rate. Encoding may be actually performed up to the value of $N_{cb}$ or only for the bits necessary for the current transmission based on the value of $rv_{idx}$. For example, when $rv_{idx}$ is 0, encoding may be performed only for the sum (E, E+Z, or E+2×Z) of the number of bits to be sent (E) and the number of punctured bits (0, Z, or 2×Z) among the information bits.

At step 860, the transmitter may determine the start position ($k_0$) of bits to be transmitted and the number of bits to be transmitted (E) among the LDPC coded bits. The start position $k_0$ is determined according to $rv_{idx}$. At step 870, the transmitter may transmit $w_{k_0}$ mod $N_{cb}$, $w_{(k_0+1)}$ mod $N_{cb}$, ... $w_{(k_0+E-1)}$ mod $N_{cb}$ among the bit stream ($w_0, w_1, w_2, \ldots, w_{Ncb}$) output at step 850. That is, based on the output bit stream W=($w_0, w_1, w_2, \ldots, w_{Ncb}$) at step 850, the number of codeword bits ($N_{cb}$), the number of transmission bits (E), and the index of the transmission start bit ($k_0$), bit stream transmission is performed as follows. The number of transmission bits (E) may be determined based on the number of allocated subcarriers and the modulation scheme, and may be determined before step 860. Here, $e_k$ denotes the bit selected from $W_k$ for transmission.

```
Set k = 0 and j = 0
while { k < E }
    if w_(k_0 + j)mod N_cb ≠ < NULL >
        e_k = w_(k_0 + j)mod N_cb
        k = k + 1
    end if
    j = j + 1
end while
```

Here, <NULL> denotes zero-padded bits. Certain bits of the information bits may always not be transmitted.

As another embodiment for step 870, it is possible to consider a case where certain bits among the information bits are always not transmitted. The certain bits are referred to as punctured systematic bits.

In another embodiment, based on the bit stream ($x_0, x_1, x_2, \ldots, x_{Ncb\_ext}$) obtained by excluding those information bits that are always punctured from the output bit stream ($w_0, w_1, w_{Ncb}$), the number of codeword bits ($N_{cb}$), the number of transmission bits (E), and the index of the transmission start bit ($k_0$), bit stream transmission is performed as follows. Here, $N_{cb\_ext}=N_{cb}-N_{sym\_p}$, where $N_{sym\_p}$ indicates the number of information bits that are always punctured. For example, if 2*Z information bits are punctured, $N_{cb\_ext}=N_{cb}-2*Z$. If the shortened Ns bits are excluded, $N_{cb\_ext}=N_{cb}-N_{sym\_p}-N_s$. The number of transmission bits (E) may be determined based on the number of allocated subcarriers and the modulation scheme, and may be determined before step 860. Here, $e_k$ denotes the bit selected from $x_k$ for transmission.

$$k_0 = \left\lceil \frac{N_{cb\_ext}}{m} \right\rceil \times rv_{idx} \text{ Or,}$$

$$k_0 = \left\lceil \frac{N_{cb\_ext}}{m \times Z} \right\rceil \times Z \times rv_{idx} \text{ Or,}$$

$$k_0 = \left\lfloor \frac{N_{cb\_ext}}{m} \right\rfloor \times rv_{idx} \text{ Or,}$$

$$k_0 = \left\lfloor \frac{N_{cb\_ext}}{m \times Z} \right\rfloor \times Z \times rv_{idx}$$

Here, m denotes the number of values of $rv_{idx}$. The index of the transmission start bit ($k_0$, bit index) is described in more detail later.

```
Set k = 0 and j = 0
while {k < E}
    if w_(k_0 + j)mod N_cbext ≠ < NULL >
        e_k = w_(k_0 + j)mod N_cbext
        k = k + 1
    end if
    j = j + 1
end while
```

In another embodiment, based on the bit stream ($x_0, x_1, x_2, \ldots, x_{Ncb\_ext}$) obtained by excluding those information bits that are always punctured from the output bit stream ($w_0, w_1, w_{Ncb}$), the number of codeword bits ($N_{cb}$), the number of transmission bits (E), and the index of the transmission start bit ($k_0$), bit stream transmission is performed as follows. Here, $N_{cb\_ext}=N_{cb}-N_{sym\_p}$, where $N_{sym\_p}$ indicates the number of information bits that are always punctured. For example, if 2*Z information bits are punctured, $N_{cb\_ext}=N_{cb}-2*Z$. If the shortened Ns bits are excluded, $N_{cb\_ext}=N_{cb}-N_{sym\_p}-N_s$. The number of transmission bits (E) may be determined based on the number of allocated subcarriers and the modulation scheme, and may be determined before step 860. Here, $e_k$ denotes the bit selected from $x_k$ for transmission.

$$k_0 = N_{sym\_p} + \left\lceil \frac{N_{cb\_ext}}{m} \right\rceil \times rv_{idx} \text{ Or,}$$

$$k_0 = N_{sym\_p} + \left\lceil \frac{N_{cb\_ext}}{m \times Z} \right\rceil \times Z \times rv_{idx} \text{ Or,}$$

$$k_0 = N_{sym\_p} + \left\lfloor \frac{N_{cb\_ext}}{m} \right\rfloor \times rv_{idx} \text{ Or,}$$

$$k_0 = N_{sym\_p} + \left\lfloor \frac{N_{cb\_ext}}{m \times Z} \right\rfloor \times Z \times rv_{idx}$$

Here, m denotes the number of values of $rv_{idx}$. The index of the transmission start bit ($k_0$, bit index) is described in more detail later.

```
Set k = 0 and j = 0
while {k < E}
    if w_(k_0 + j)modN_cbext ≠ < NULL >
        e_k = w_{N_sym_p + (k_0-N_sym_p + j)modN_cbext}
        k = k + 1
    end if
    j = j + 1
end while
```

Figure 9A:
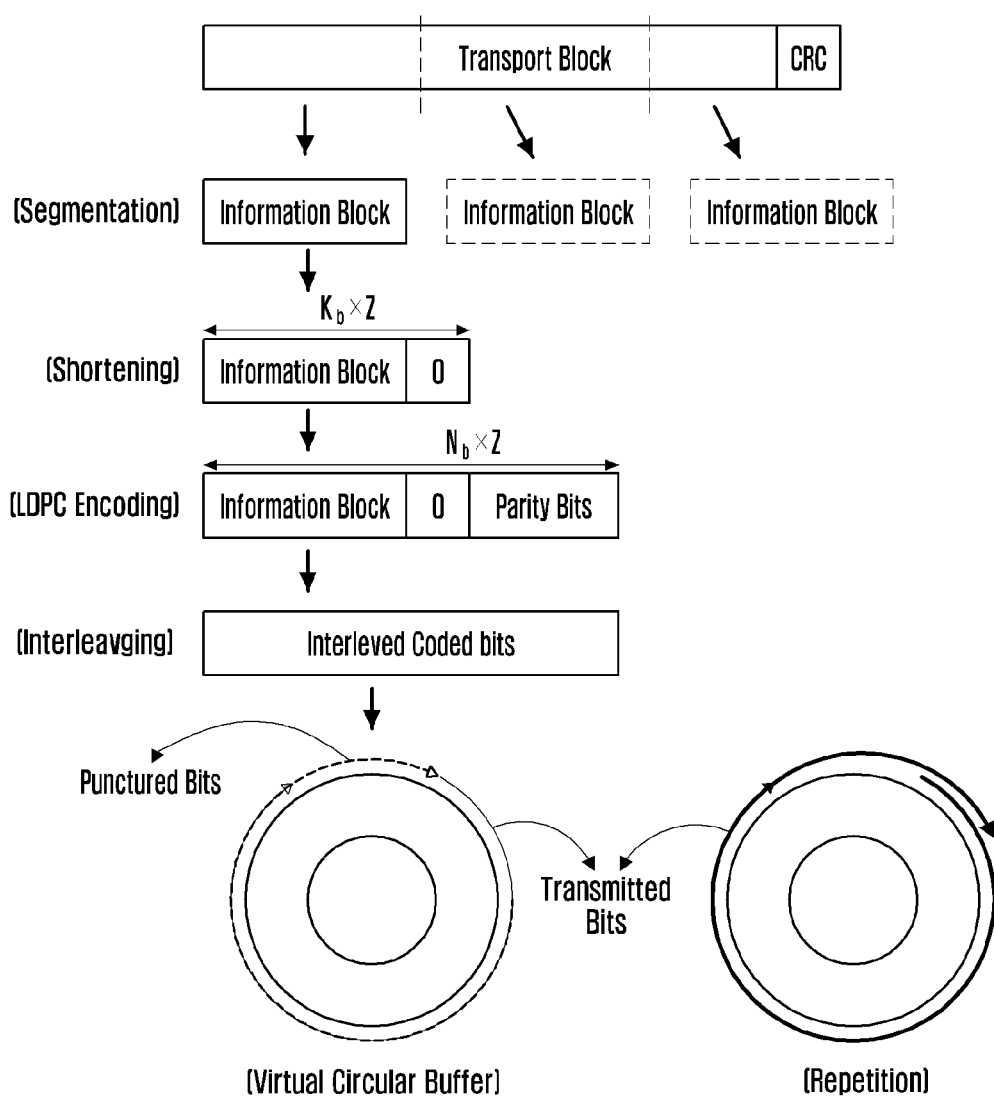
FIGS. 9A and 9B illustrate a transmission procedure according to an embodiment of the present disclosure.
Figure 9B:
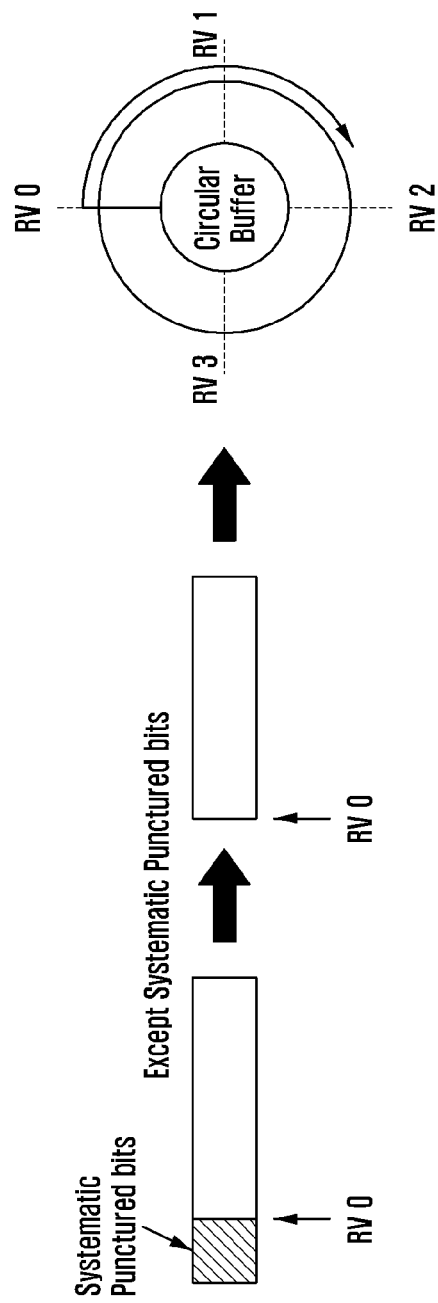

FIGS. 9A and 9B illustrate the process of encoding data according to the present disclosure. As shown in FIGS. 9A and 9B, in the transmitter, the transport blocks are segmented into information blocks and the information block contains zero padding bits so that the total length becomes $K_b \times Z$ (i.e., a multiple of Z). The information block is LDPC-encoded, and the total length of the codeword becomes $K_b \times Z$. The codeword bits may be interleaved. After $k_0$ is determined, the transmitter removes the zero padded bits and transmits the codeword bits.

In the present disclosure, the transmitter determines the value of $k_0$ ($=S_{idx}$) indicating the position of the transmission start bit based on the value of $rv_{idx}$, and performs transmission in sequence from the codeword bit indexed by $k_0$. During transmission, it is not necessary to determine all values of $S_{idx}$ according to $rv_{idx}$ (=0, 1, 2 or 3), and the index of the transmission start bit (i.e., $S_{idx}$ or $k_0$) may be determined based on $rv_{idx}$ for transmission. When m redundancy versions (RV) are defined, $RV=\{rv_0, rv_1, rv_{(m-1)}\}$ and $rv_{idx}=\{0, 1, 2, \ldots, m-1\}$. The index of the start bit based on $rv_{idx}$ is $S=\{s_0, s_1, \ldots, s_{(m-1)}\}$.

FIG. 9A depicts an embodiment where a portion of the information bits are always punctured and not input to the circular buffer.

In the present disclosure, a description is given of a method of determining the sequence of transmission, i.e., the sequence of redundancy versions (RV), at the initial retransmission of data. The sequence of the RV can be set differently according to the index of the modulation and coding scheme (MCS). That is, the sequence of redundancy versions is defined according to the MCS index ($I_{MCS}$).

The current LTE standard provides HARQ modes as shown in Table 1 below.

TABLE 1

| Non-adaptive mode | Adaptive mode |
|---|---|
| During retransmission, initial transmission equals $I_{MCS}$ | During retransmission, initial transmission equals $I_{MCS}$ |
| Fixed $RV_{idx}$ value sequence (0, 2, 3, 1) | No fixed $RV_{idx}$ value sequence |

In the case of retransmission in the non-adaptive HARQ mode of the LTE system, for uplink transmission, when the base station transmits NACK via the downlink physical HARQ channel (PHICH) without transmitting separate downlink control information (DCI, i.e., UL grant) for data scheduling, the terminal automatically performs retransmission in sequence of redundancy version (RV) 0, 2, 3 and 1 at preset time points.

However, in the case of using an LDPC code, the matrix for the LDPC code may change when the code rate is changed during data transmission, so that additional considerations are needed. To support the IR mode, the present disclosure proposes a method of transmitting LDPC codeword bits from a specific bit position based on $rv_{idx}$.

Figure 10:
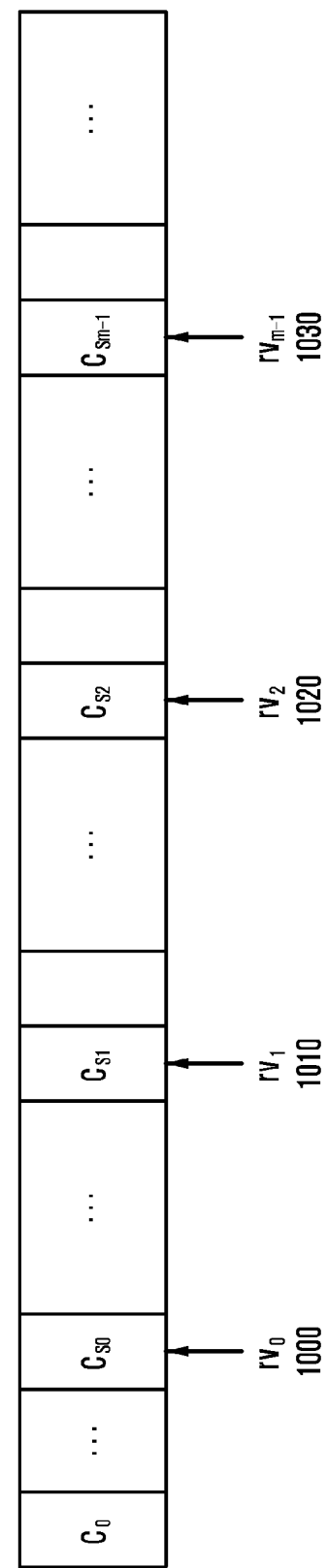
FIG. 10 illustrates an LDPC codeword and bit positions preset for retransmission of the LDPC codeword.

FIG. 10 illustrates an LDPC codeword and bit positions preset for retransmission of the LDPC codeword. As shown in FIG. 10, the position of certain bits among the LDPC codeword bits may be indicated by a redundancy version (rv). In FIG. 10, the positions of m specific bits $rv_0$(1000), $rv_1$(1010), $rv_2$(1020), ..., $rv_{m-1}$(1030) are indicated by the values of rv or $rv_{idx}$. The $rv_{idx}$ value of $rv_0$(1000) is 0; the $rv_{idx}$ value of $rv_1$(1010) is 1; the $rv_{idx}$ value of $rv_2$(1020) 2; and the $rv_{idx}$ value of $rv_{m-1}$(1030) is m−1. After generating an LDPC codeword, the transmitter can transmit it from the position indicated by rv. For example, the transmitter may transmit from the bit indicated by $rv_0$ at the first transmission, and transmit from the bit indicated by $rv_1$ at the second transmission.

The present disclosure discloses a method that can determine start positions for initial transmission or retransmission according to a preset rule and in particular change the transmission sequence according to the code rate of the initial transmission. Here, the transmission sequence means the sequence of the $rv_{idx}$ values or the sequence of transmission start bit indexes.

When data is transmitted from the start position determined by a preset rule, additional signaling bits are not needed, so that the system overhead can be reduced. On the other hand, since the data is transmitted according to a preset rule, the additional coding gain, which can be obtained in accordance with the code rate, may be limited.

Figure 11A:
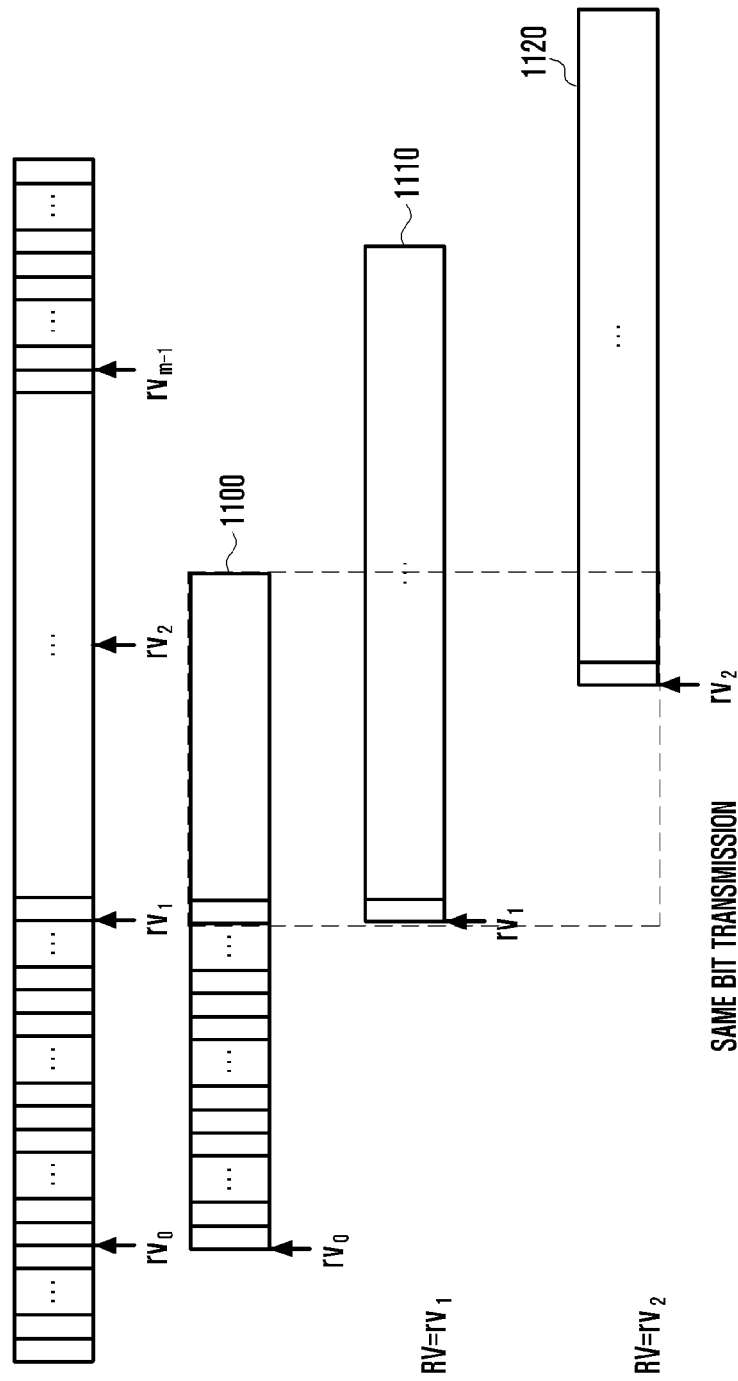
FIGS. 11A and 11B illustrate a codeword repeated during retransmission according to the code rate.
Figure 11B:
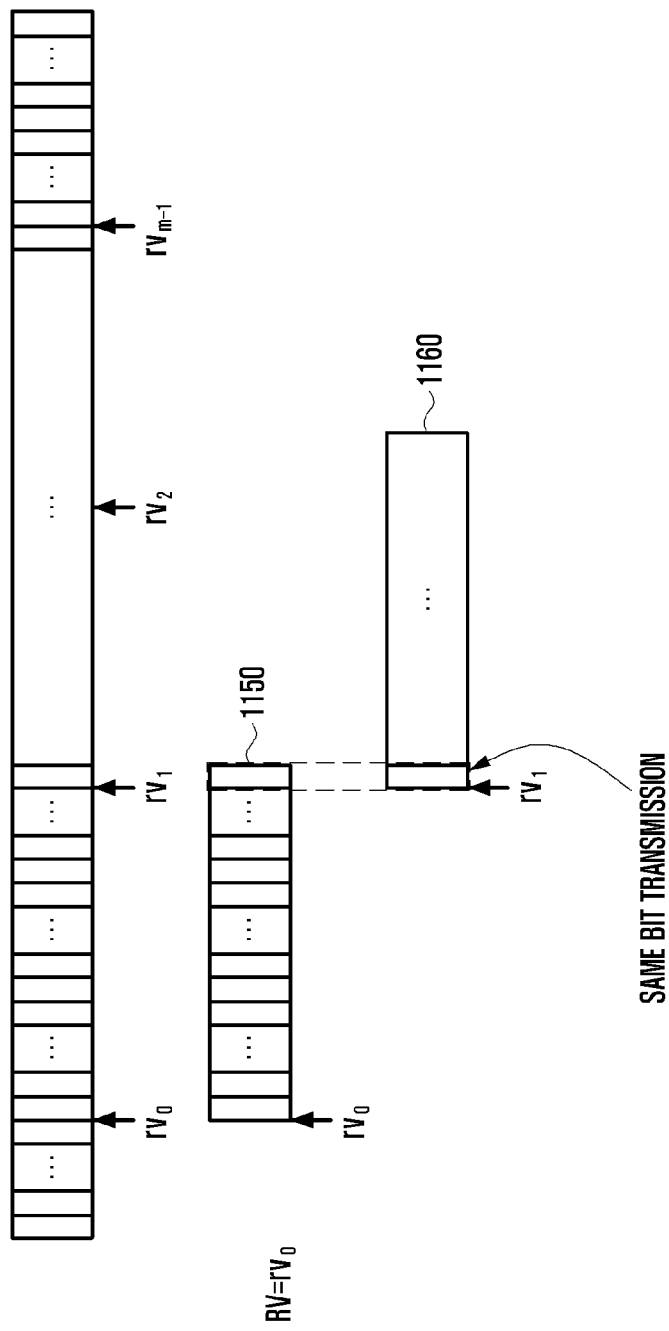

FIGS. 11A and 11B illustrate a codeword repeated during retransmission according to the code rate. To apply the LDPC code for coding based on the parity check matrix of FIGS. 6A and 6B according to the present disclosure, the following points are important in retransmission. In the incremental redundancy bit part of the parity bits encoded based on the parity check matrix shown in FIGS. 6A and 6B, the fore parity bits close to the information bits are important. Hence, a high coding gain can be obtained when the parity bits are selected in sequence during retransmission. Also, as the bit redundancy occurring during retransmission is reduced, the efficiency increases. That is, a high coding gain can be obtained through sequential transmission without duplication (i.e., transmission with a lower error probability is possible).

As shown in FIG. 11A, when the code rate is low, if the RV is rv0 ($rv_{idx}$=0) at the initial transmission 1100, is rv1 ($rv_{idx}$=1) at the first retransmission 1110, and is rv2 ($rv_{idx}$=2) at the second retransmission 1120, the coding gain cannot be maximized because many bits are repeatedly transmitted. Here, if the RV is $rv_0$ at the initial transmission and is not $rv_1$ at the first retransmission, a high coding gain may be obtained.

On the other hand, as shown in FIG. 11B, when the code rate is high, if the RV is rv0 at the initial transmission 1150 and is rv1 at the first retransmission 1160, the number of repeatedly transmitted bits among those codeword bits transmitted respectively from the bits indicated by rv0 and rv1 may be less (or zero) in comparison to the case where the data is transmitted at a low code rate. Hence, a higher coding gain can be obtained in the case of FIG. 11B than in the case of FIG. 11A.

Considering this point, the present disclosure proposes a method of determining the transmission sequence during retransmission as follows.

First, one of the preset transmission sequences can be selected and applied according to the initial transmission code rate. For example, when there are four rv values, one of the four transmission sequences may be selected according to the code rate.

TABLE 2

| $RV_{idx}$ order indicator | $RV_{idx}$ sequence for transmission |
|---|---|
| 0 | 0 3 2 1 |
| 1 | 0 2 1 3 |
| 2 | 0 1 2 3 |
| 3 | 0 0 0 0 |

Second, as an example of specifying the transmission sequence, one of the four transmission sequences may be selected to transmit the codeword according to the assigned modulation and coding scheme (MCS) index.

TABLE 3

| MCS index | Modulation scheme | Code rate | $RV_{idx}$ order indicator |
|---|---|---|---|
| 0 | 2 | 1/2 | 0 |
| 1 | 4 | 2/3 | 1 |
| 2 | 8 | 4/5 | 2 |

The code rate may be not specified in the MCS table of Table 3 above.

Third, the effective code rate ($R_{eff}$) determined based on the MCS index, the transport block size (TBS), the number of subcarriers through which codeword bits are to be transmitted, and the like may be compared with preset thresholds ($R_{th\_i}$, i=0, 1, 2, . . . , $N_{order}$−1). Better performance may be achieved using a specific RV sequence depending on the result of the comparison. This can be performed using Equation 17 below. Here, Reef is the ratio between the number of TBS bits and the number of TBS-based codeword bits transmitted. The effective code rate may be computed in different ways according to the frame structure, and it may be computed by, for example, (TBS+$N_{CRC}$)/($N_{PRB}$×(#REs per PRB−#REs for reference signaling)×modulation order). Here, #REs refers to the number of resource elements, $N_{CRC}$ indicates the number of CRC bits and may be zero. $N_{PRB}$ denotes the number of allocated resource blocks, and #RE for reference signaling denotes the number of resource elements allocated to reference signaling. TBS means the number of bits that can be transmitted when specific $I_{TBS}$ and $N_{PRB}$ are applied. Alternatively, when transport blocks (TB) are segmented into code blocks (CB) and retransmission is performed in units of CBs or CB groups (CBGs), $R_{eff}$ may be the ratio between the CB size or number of CBG bits and the number of codeword bits to carry CB or CBG.

$$RV \text{ index order indicator}=i \text{ if } R_{eff} < R_{th\_i} (0 \le i < N_{order}) \quad \text{Equation 17}$$

$N_{order}$ is the maximum of the possible RV index order indicators specified in Table 2 and means the maximum number of RV index orders. The value of $R_{eff}$ may be determined based on $I_{MCS}$.

When using this scheme, the transmitter can perform data transmission in a preset sequence even if the receiver does not directly notify the $rv_{idx}$ value via signaling such as DCI.

In addition, a different $rv_{idx}$ sequence can be used for each parity check matrix. Also, the $rv_{idx}$ sequence can be determined according to the MCS index, the TBS index or MCS index ($I_{MCS}$) determined according to the modulation order, and $N_{PRB}$ (the size of physical resources used for data transmission).

Alternatively, in the present disclosure, it is possible to obtain the same effect by performing transmission using different interleavers according to the initial transmission code rate after fixing the $rv_{idx}$ sequence non-adaptively.

Figure 12A:
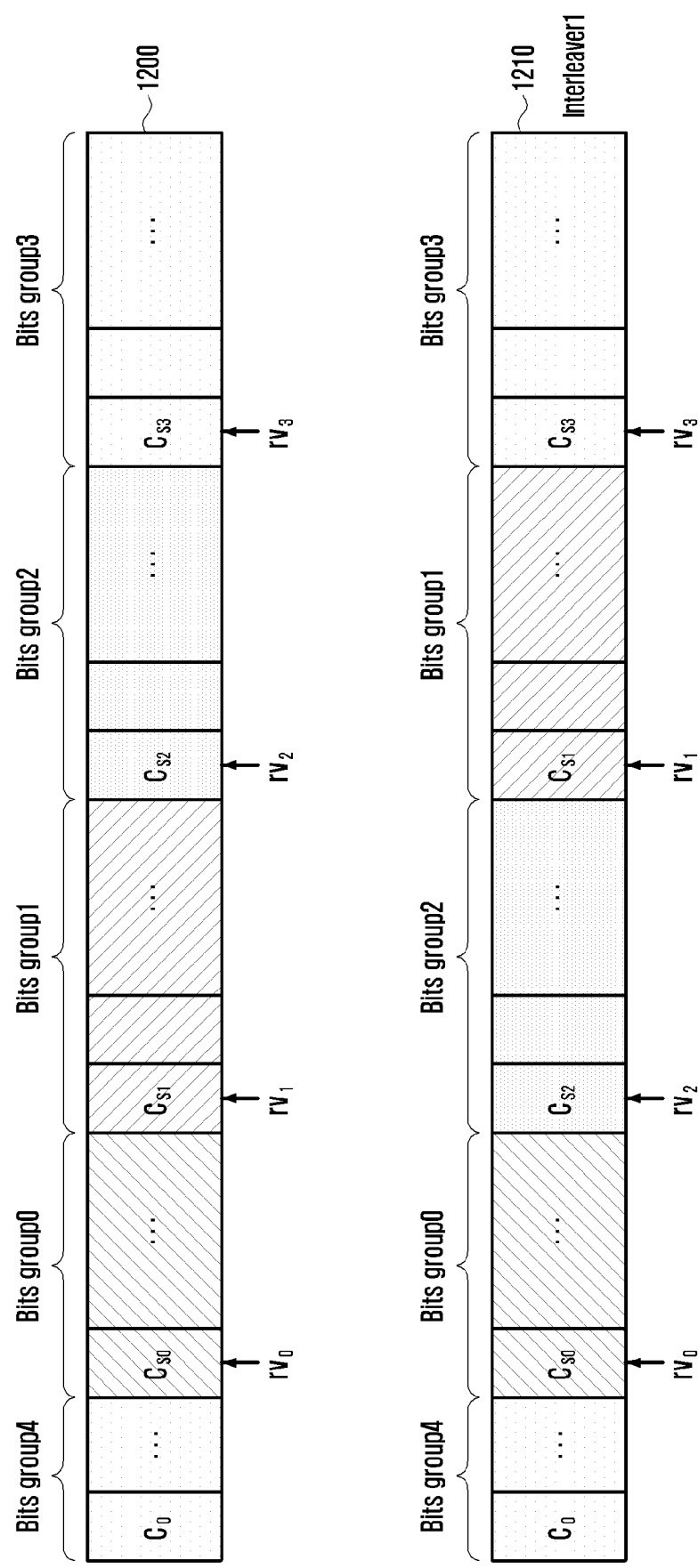
FIGS. 12A and 12B illustrate determining the retransmission start point according to the initial code rate.
Figure 12B:
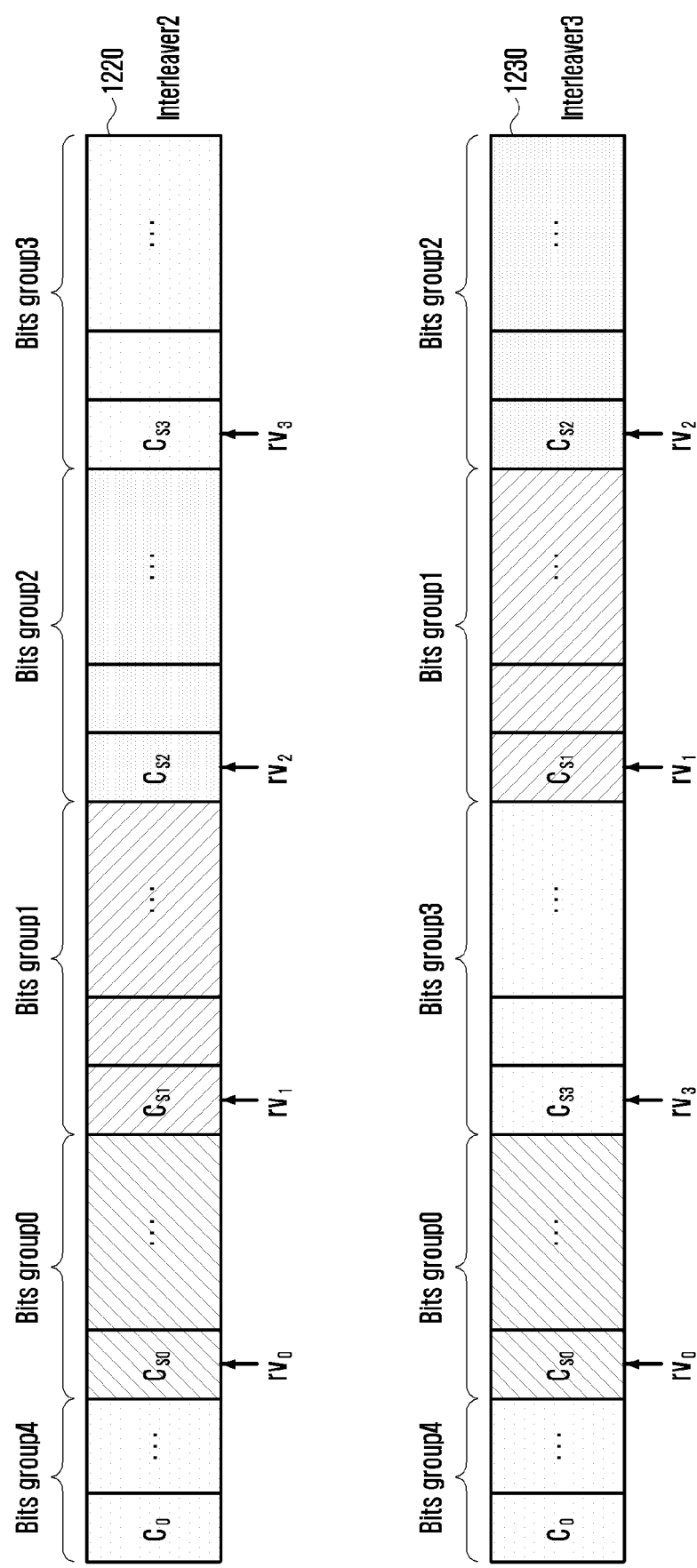

FIGS. 12A and 12B illustrate transmitted codewords when different interleavers are used. In FIGS. 12A and 12B, indicia 1200 indicates a case where the transmission sequence is fixed and the codeword is transmitted in sequence of $rv_0$, $rv_1$, $rv_2$ and $rv_3$. Here, the codeword bits (=$c_0, c_1, c_2, \ldots, c_{N-1}$) are divided into bit groups according to those bits indexed by $S_{idx}$ specified by $rv_{idx}$. For example, bit-group 0 is composed of $c_{s0}, \ldots, c_{\{s1-1\}}$. Bit-group 1 is composed of $c_{s1}, \ldots, c_{\{s2-1\}}$. Bit-group 2 is composed of $c_{s2}, \ldots, c_{\{s3-1\}}$. Bit-group 3 is composed of $c_{s3}, \ldots, c_{\{N\}}$. Bit-group 4 is composed of $c_0, \ldots, c_{\{s0-1\}}$.

In this case, when interleaver 1 is applied, it arranges the bit groups in sequence of bit-group 4, bit-group 0, bit-group 2, bit-group 1 and bit-group 3 as indicated by indicia 1210. Hence, when the codeword is transmitted, the transmitter can actually change the transmission start bit even if it uses the same $rv_{idx}$ sequence as when the interleaver is not applied. When interleaver 3 is applied, it arranges the bit groups in sequence of bit-group 0, bit-group 3, bit-group 1, and bit-group 2 as indicated by indicia 1230. Hence, the transmitter can also actually change the transmission start bit even if it uses the same $rv_{idx}$ sequence as when the interleaver is not applied. That is, using different interleavers according to the code rate can achieve the same effect as changing the $rv_{idx}$ sequence according to the code rate. Consequently, as a means for reducing signaling overhead, it is possible to obtain the coding gain by applying a different interleaver according to the initial transmission code rate while using a preset $rv_{idx}$ sequence.

In addition, the present disclosure discloses a method of determining the index of the bit designated by $rv_{idx}$ (redundancy version index), that is, the value of $S_{idx}$. As described before, when the codeword bits are transmitted, the value of $S_{idx}$ is determined based on $rv_{idx}$ and transmission is performed in sequence from the bit indexed by $S_{idx}$.

First, it is possible to determine the number of codeword bits based on the code rate at the initial transmission in consideration of the maximum $rv_{idx}$ value (=m−1), and adjust the interval between $S_{idx}$ values indicated by individual $rv_{idx}$ values. If the code rate at the initial transmission is high, the code rate at retransmission based on the maximum $rv_{idx}$ value may be higher than the minimum code rate that the LDPC code can support. For example, when the code rate at initial transmission is 8/9, the minimum code rate that can be supported is 1/5, and the maximum $rv_{idx}$ value (m−1) is 3, the code rate at maximum retransmission is 8/36 (=8/9×1/4), which is higher than 1/5. Here, the case where the number of codeword bits (=$N_{cb}$) is determined based on the code rate of 8/36 and the $S_{idx}$ is set correspondingly may produce a higher coding gain than the case where the number of codeword bits (=Neb) is determined based on the code rate of 1/5 and the $S_{idx}$ is set correspondingly.

Additionally, in the present disclosure, when the maximum value of $rv_{idx}$ is (m−1), the length of the codeword bits ($N_{cb}$) is set to a value less than or equal to k/R*m. Here, k is the number of information bits and may equal CBS or $K_b \times Z$. The code rate R may be specified as a value according to $I_{MCS}$ in the MCS table, or the effective code rate may be used as R. The effective code rate may be changed according to the number of information bits and the number of RBs allocated for transmission (i.e., the size of resources).

For example, the value of $N_{cb}$ may be determined using Equation 18 below.

$$N_{cb} = \min\left(\frac{k}{R} \times m, N_b \times Z\right), \text{ or} \quad \text{Equation 18}$$

$$N_{cb} = \min\left(\left\lceil \frac{k \times m}{R \times Z} \right\rceil \times Z, N_b \times Z\right)$$

It is possible to consider the case in which certain $N_{sym\_p}$ bits among the information bits are always not transmitted. These $N_{sym\_p}$ bits are referred to as punctured systematic bits.

In this case, $N_{cb\_ext}$ in the second embodiment is determined based on Equation 18-1 below.

$$N_{cb\_ext} = \min\left(\frac{k}{R} \times m, N_b \times Z\right) - N_{sym\_p}, \text{ or}$$

$$N_{cb\_ext} = \min\left(\left\lceil\frac{k \times m}{R \times Z}\right\rceil \times Z, N_b \times Z\right) - N_{sym\_p}, \text{ or}$$

$$N_{cb\_ext} = \min\left(\frac{k}{R} \times m, N_b \times Z\right) - N_{symp_p} - N_s, \text{ or}$$

$$N_{cb\_ext} = \min\left(\left\lceil\frac{k \times m}{R \times Z}\right\rceil \times Z, N_b \times Z\right) - N_{symp_p} - N_s$$

Equation 18-1

Here, $N_s$ indicates the number of shortened bits.

When the limited buffer is used, the value of $N_{cb}$ is set to the smaller one of $N_{cb}$ and the limited buffer size, and the value of $N_{cb\_ext}$ is set to the smaller one of $N_{cb\_ext}$ and the limited buffer size.

$N_b$ is the number of column blocks of the parity check matrix of the LDPC code and may be varied according to the value of CBS. $N_b$ is less than or equal to the maximum number of column blocks ($N_{bmax}$) of the parity check matrix. As described before, the value of $N_{cb}$ may be changed according to at least one of the code rate, UE category, parity check matrix, uplink or downlink, and information word length. The value of k may be equal to CBS or the number of input bits ($K_b \times Z$) of the LDPC code, which is equal to the value obtained by adding the number of zero padding bits to CBS. Here, Equation 19 below may be used to determine the value of $S_{idx}$ based on $rv_{idx}$ (0, 1, . . . , (m−1)) or the index $k_0$ of the transmission start bit.

$$S_{idx} = \left(a + \frac{N_{cb}}{m} \times rv_{idx}\right) \bmod N_{cb}, \text{ or}$$

$$k_0 = \left(a + \frac{N_{cb}}{m} \times rv_{idx}\right) \bmod N_{cb}$$

Equation 19

Here, the value of m may be changed according to the initial transmission code rate. The value of m may also be changed according to the parity check matrix, UE category, and uplink or downlink. The value of a indicates the position of $S_0$ with $rv_{idx}=0$, and may be equal to Z (the size of the sub-matrix of the parity check matrix of the LDPC code), a multiple of Z, or zero.

The transmitter may perform actual encoding up to $N_{cb}$ or only up to the bit needed for transmission.

Figure 13A:
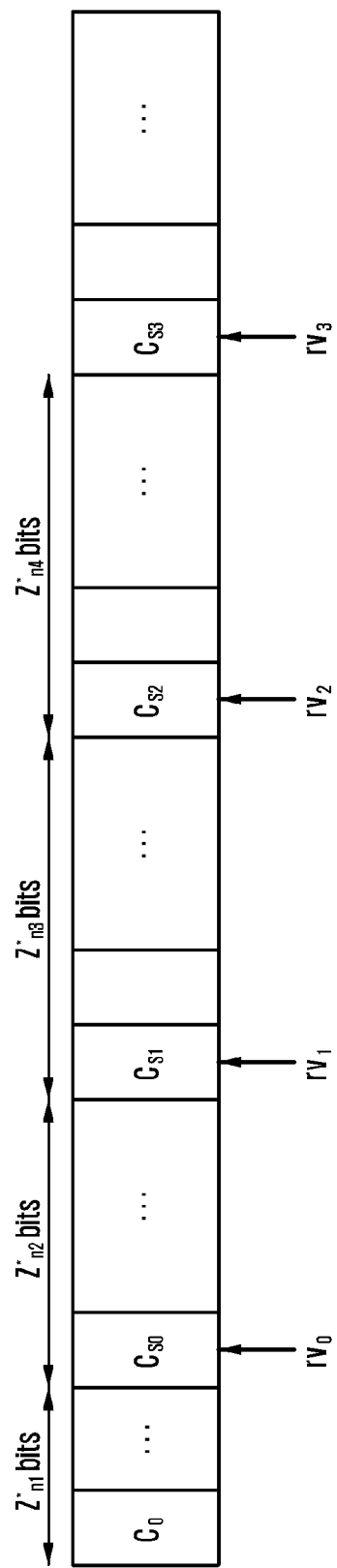
FIG. 13A illustrates determining the position of the rv value according to the present disclosure.

Second, the $S_{idx}$ values (i.e. $k_0$) are set to a multiple of the lifting value Z for determining the parity check matrix. This is to facilitate the decoder operation. FIG. 13A illustrates determining the retransmission start point and shows the $S_{idx}$ values determined by the value of $rv_{idx}$ determined according to the above scheme. As shown in FIG. 13A, the $S_{idx}$ values correspond to a multiple of Z. To this end, in the present disclosure, the $S_{idx}$ values are determined when zero padding bits are included.

Here, $S_{idx}$ may be determined using Equation 20 below.

$$S_{idx} = \left(\left\lfloor\frac{N_{cb}}{Z \times m}\right\rfloor \times Z \times rv_{idx} + a\right) \bmod N_{cb}, \text{ or}$$

$$k_0 = \left(\left\lfloor\frac{N_{cb}}{Z \times m}\right\rfloor \times Z \times rv_{idx} + a\right) \bmod N_{cb}, \text{ or}$$

Equation 20

-continued $$S_{idx} = \left(\left\lfloor\frac{N_{cb}}{Z \times m}\right\rfloor \times Z \times rv_{idx} + a\right) \bmod N_{cb}, \text{ or}$$

$$k_0 = \left(\left\lfloor\frac{N_{cb}}{Z \times m}\right\rfloor \times Z \times rv_{idx} + a\right) \bmod N_{cb}$$

The value of $rv_{idx}$ is $0 \leq i < m$ and m may be changed according to the code rate. Nib is the number of codeword bits in consideration of retransmission, and may be determined according to Equation 18. Or, $N_{cb}=\min(N_{bmax}*Z, N_{max})$. $N_{bmax}$ is the maximum number of column blocks of the parity check matrix shown in FIGS. 6A and 6B. $N_{max}$ is the maximum number of encoding bits set in advance. When $N_{max}$ is not set, Nib may be equal to $N_{bmax} \times Z$. As described before, the value of $N_{cb}$ may be changed according to at least one of the code rate, UE category, parity check matrix, uplink or downlink, and information word length. The value of a indicates the position of $S_0$ with $rv_{idx}=0$, and may be equal to Z (the size of the sub-matrix of the parity check matrix of the LDPC code), a multiple of Z, or zero. Actual encoding may be performed up to Neb or only for the bits needed for transmission (=E).

Third, the interval between $S_{idx}$ values can be set differently according to the code rate. Specifically, the position of the transmission start point can be determined by Equation 21 below.

$$S_{idx} = (a + \alpha_R \times rv_{idx}) \bmod N_{cb}, \text{ or}$$

$$k_0 = (a + \alpha_R \times rv_{idx}) \bmod N_{cb}$$

Equation 21

The value of $\alpha_R$ may be preconfigured by higher layer signaling (RRC signaling), MAC CE, or downlink physical layer signal (L1 DL control), and it may also be computed directly by the transceiver. The value of $\alpha_R$ may be determined differently depending on the code rate and the information word length (i.e., CBS). Specifically, $\alpha_R$ may be preset according to the MCS index, the TBS index determined based on the MCS index and the modulation order, or the MCS index and $N_{PRB}$ (the size of the physical resources used for data transmission). For example, $\alpha_R = k/R$, where R is the initial transmission code rate and may be determined by the MCS index. The value of $\alpha_R$ may be different depending on the parity check matrix and the UE category. The value of $rv_{idx}$ is $0 \leq i < m$ and m may be changed according to the code rate. $N_{cb}$ is the number of codeword bits in consideration of retransmission, and may be determined according to Equation 18. Or, $N_cb=\min(N_{bmax}*Z, N_{max})$. Or, $N_{cb}=\min(N_b \times Z, N_{max})$. $N_{bmax}$ is the maximum number of column blocks of the parity check matrix shown in FIGS. 6A and 6B. $N_b$ is less than or equal to $N_{bmax}$ and is determined according to a preset rule. $N_{max}$ is the maximum number of encoding bits set in advance.

When $N_{max}$ is not set, $N_{cb}$ is set to $N_{bmax} \times Z$ or $N_b \times$ Zero ($N_{cb}=N_{bmax} \times Z$ or $N_{cb}=N_b \times Z$). As described before, the value of $N_{cb}$ may be changed according to at least one of the code rate, UE category, parity check matrix, uplink or downlink, and information word length. The value of a indicates the position of $S_0$ with $rv_{idx}=0$, and may be equal to Z (the size of the sub-matrix of the parity check matrix of the LDPC code), a multiple of Z, or zero. Actual encoding may be performed up to $N_{cb}$ or only for the bits needed for transmission (=E, the number of codeword bits to be transmitted). When Sick is determined by the third method, the $S_{idx}$ value with small idx may be greater than the Sick value with large idx (i.e., $S_1 > S_2$).

If the above method is used, it is possible to minimize the number of identical bits among those bits transmitted when RV is $rv_i$ (i.e., $rv_{idx}=i$) and those bits transmitted when RV is $rv_{i+1}$ (i.e., $rv_{idx}=i+1$). Hence, the coding gain can be maximized by using RVs in sequence during retransmission.

As described in the second and third embodiments, when specific information bits are always not transmitted, the Nib value of Equation 21 can be determined using Equation 18-1. For the second embodiment, the value of a in Equation 21 can be zero.

Next, a detailed description is given of $\alpha_R$. As described above, when the HARQ-IR scheme is used for retransmission, the codeword gain can be obtained by transmitting new codeword bits as much as possible. It is helpful to vary the position of the transmission start bit according to the rv value based on the code rate so that the codeword gain can be maximized. Specifically, the transmission start point may be determined as a multiple of the size of the circulant permutation matrix of the parity check matrix based on a specific value $\alpha_R$ as shown in Equation 22 below.

$$S_{idx}=(a+\alpha_R \times Z \times rv_{idx}) \bmod N_{cb}, \text{ or}$$

$$k_0=(a+\alpha_R \times Z \times rv_{idx}) \bmod N_{cb} \qquad \text{Equation 22}$$

Here, a indicates the position of the transmission start bit when $rv_{idx}=0$, and may be a preset value. As described in the second and third embodiments, when specific information bits are always not transmitted, the $N_{cb}$ value of Equation 22 can be determined using Equation 18-1. For the second embodiment, the value of a in Equation 22 can be zero.

The value of $\alpha_R$ may be changed depending on the code rate and the information word length (i.e., CBS). Specifically, $\alpha_R$ may be preset according to the MCS index, the TBS index determined based on the MCS index and the modulation order, or the MCS index and $N_{PRB}$ (the size of the physical resources used for data transmission). In Equation 22, $\alpha_R$ and a may be determined differently according to at least one of the code rate, information word length (TBS (transport block size), CBS (code block size), CBGS (code block group size)), UE category, parity check matrix, and uplink or downlink. For example, $\alpha_R$ may always be set to a fixed value associated with one of the listed elements.

For instance, $\alpha_R$ may be given by Equation 23 below.

$$\alpha_R = \left\lfloor \frac{K_b}{R} \right\rfloor, \text{ or } \alpha_R = \left\lceil \frac{K_b}{R} \right\rceil \qquad \text{Equation 23}$$

The code rate R may be preconfigured by higher layer signaling (RRC signaling), MAC CE, or downlink physical layer signal (L1 DL control), and it may also be computed directly by the transceiver. Or, R may be given in the MCS table. Or, R=f(k/E), which means that R is a function of k/E. Here, k is the number of information bits (the length of the information word of the LDPC code, the length of TBS, CBS or CBG bits plus CRC bits if necessary), and E is the number of codeword bits to be transmitted. The number of codeword bits to be transmitted (E) may be determined according to the frame structure in which the information bits are coded and transmitted, the number of layers, and the modulation scheme. $K_b$ is the number of column blocks in the information-word part of the parity check matrix of the LDPC code, and it may be changed according to the length of the information word of the LDPC code (k). For example, $K_b=k/Z$. That is, $K_b$ depends on k and Z. Z is the size of the circulant permutation matrix of the parity check matrix of the LDPC code. The information word of the LDPC code is a bit string in which zero bits are padded to CB (or bit string including CRC in TB).

Alternatively, in the MCS table, the value of 1/R can be converted into an integer. That is, a specific integer value specified for each MCS index in the MCS table is defined as $\alpha_R$ or 1/R. Here, the higher the code rate, the smaller the value of $\alpha_R$.

Or, $\alpha_R$ may be specified using Equation 24 below.

$$\alpha_R=K_b \times f(I_{MCS}), \text{ or } \alpha_R=\lfloor K_b \times f(I_{MCS}) \rfloor, \text{ or } \alpha_R=\lceil K_b \times f(I_{MCS}) \rceil \qquad \text{Equation 24}$$

When determining the transmission start bit based on Equation 21 or 22, determining the value of $\alpha_R$ based on the code rate of the previous transmission may result in better performance. During retransmission, the same transmission code rate as the previous transmission (or initial transmission) means that the number of codeword bits transmitted during retransmission is equal to the number of codeword bits transmitted in the previous transmission (or initial transmission). For example, it means that the allocated MCS index and the number of subcarriers (or the number of PRBs) are not changed. If the transmission code rate at retransmission is different from the transmission rate at the previous transmission (or initial transmission), R or $I_{MCS}$ in Equation 23 or 24 may be used based on the transmission code rate or MCS index at the previous transmission. In this case, the transceiver needs to store information regarding the transmission code rate, the number of transmitted codeword bits, MCS, and/or $N_{PRB}$ at the previous transmission.

Or, a method of determining the value of $\alpha_R$ based on the RV mode indicator included in the downlink control information may be used as follows. Here, the RV mode indicator included in the downlink control information can indicate whether the code rate used for data transmission at the initial transmission is the same as the code rate used in the current transmission (retransmission). The RV mode indicator included in the uplink control information may indicate whether the code rate used for data transmission at the initial transmission is the same as the code rate used for data to be transmitted in the future.

Based on the RV mode indicator, if the transmission parameters of the previous transmission and the current transmission are the same (e.g., indicator=0), the value of $\alpha_R$ may be determined based on the current transmission parameters (e.g., transmission code rate and information bits). If the transmission parameters of the previous transmission and the current transmission are not the same (e.g., indicator=1), the value of $\alpha_R$ may be determined based on a specific fixed value (e.g., the number of rv indexes).

Figure 13B:
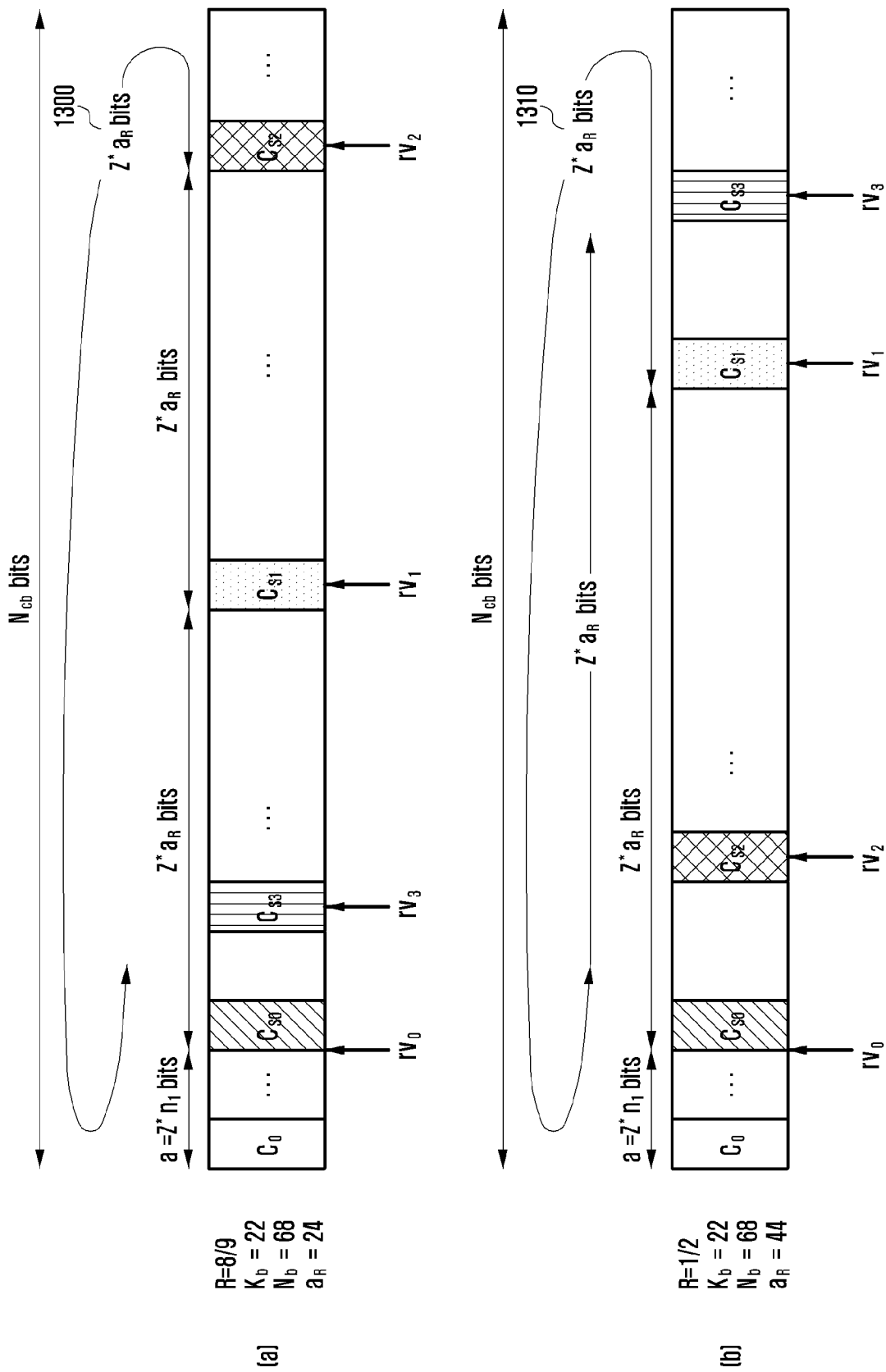
FIG. 13B illustrates the bits transmitted according to the value of $\alpha_R$ in the present disclosure.

Next, a description is given of the characteristics of $\alpha_R$. FIG. 13B illustrates the bits transmitted according to the value of $\alpha_R$. It can be seen from FIG. 13B that the number of bits transmitted at retransmission is different as $\alpha_R$ and are changed although $k_b$ and $N_b$ are fixed. For example, in part (a) of FIG. 13B, when the code rate R is 8/9 and the value of $\alpha_R$ is 24, the bits transmitted at the third transmission (second retransmission) is indicated by indicia 1300. In part (b), when the code rate R is 1/2 and the value of $\alpha_R$ is 44, the bits transmitted at the second transmission is indicated by indicia 1310.

$\alpha_R$ may have the same value within a specific range of the code rate or within a specific range of the MCS index. For example, $\alpha_R=\lfloor K_b \times 9/8 \rfloor$ within a range from a code rate of 5/6 to a code rate of 8/9. The code rate or $\alpha_R$ may be configurable. As described above, $\alpha_R$ may be determined differently according to at least one of the code rate, information word length (TBS, CBS, CBGS), uplink or downlink, and UE category.

In addition, $\alpha_R$ in Equation 22 may have different values depending on a combination of the code rate and the information word length. For example, for the same code rate, the value of $\alpha_R$ may be larger when the information word length is short than when the information word length is long. This is because the number of codeword bits ($N_{cb}$) may be larger when the information word length is short than when the information word length is long. If the length of the LDPC codeword to be transmitted is long, the size of the decoder memory at the receiver side must be increased, and thus the length of the codeword (or $N_{cb}$) may be limited according to the information word length. In addition, $N_{cb}$ and $N_b$ may be changed depending on the size of the user buffer and the number of HARQ processes. Hence, the maximum number of rv indexes and $\alpha_R$ may vary depending on the UE category.

In another embodiment, the positions of the transmission start point may be determined differently according to at least one of the code rate, modulation scheme, bit interleaver, information word length (transport block size (TBS), code block size (CBS), code block group size (CBGS)), number of transmitted bits, parity check matrix, UE category, and uplink or downlink transmission. When a high order modulation scheme is used, performance may be better if the positions mapped to the modulation symbols are changed while retransmitting some of bits already transmitted. Hence, considering retransmission of the same bits when a high order modulation scheme is employed, it is possible to improve the system performance by determining the position of the transmission start point according to the RV mode indicator.

In a simple way, it is possible to define the transmission start points as a set having elements corresponding to the number of included RV mode indicators. Here, the set indicating the positions of transmission start points may be determined differently according to at least one of the code rate, modulation scheme, information word length (transport block size (TBS), code block size (CBS), code block group size (CBGS)), number of transmitted bits, parity check matrix, UE category, and uplink or downlink transmission.

For example, when the number of column blocks of the parity check matrix is 68 and the input bits related to two column blocks are always punctured and are not transmitted, the codeword bits ($N_{cb}$) are 66*Z, and the set indicating the positions of transmission start points can be defined as follows. Here, Z is the size of the circulant permutation matrix of the parity check matrix of the LDPC code. In the following description, the position of the transmission start point means the position from the remaining bits excluding those bits that are always punctured.

Set1={0, 17*Z, 33*Z, 50*Z}
Set2={0, 25*Z, 33*Z, 50*Z}
Set3={0, 28*Z, 33*Z, 50*Z}

If (R>=0.89 and MOD=256 QAM) or (R>=0.89 and MOD=64QAM) or (R>=0.89 and MOD=16 QAM) then starting positions set is set3
  else if (R>=0.82 and MOD=256 QAM) or (R>=0.82 and MOD=64QAM) or (R>=0.77 and MOD=16 QAM) or (R>=0.77 and MOD=QPSK) then starting positions set is set2
  else then starting positions set is set1

As another example, when the number of column blocks in the parity check matrix is 68, at least one of the sets set1, set2, and set3 is used for all code rates and modulation schemes.

Here, these sets may be represented by set1={0, 17, 33, 50}, set2={0, 25, 33, 50}, and set3={0, 28, 33, 50}.

As another example, when the number of column blocks of the parity check matrix is 68 and the input bits related to two column blocks are always punctured and are not transmitted, the set representing the positions of the transmission start points indicated by the RV mode indicator may be {0, 15*Z, 23*Z, 37*Z}. This set may be represented by {0, 15, 23, 37}.

Figure 23A:
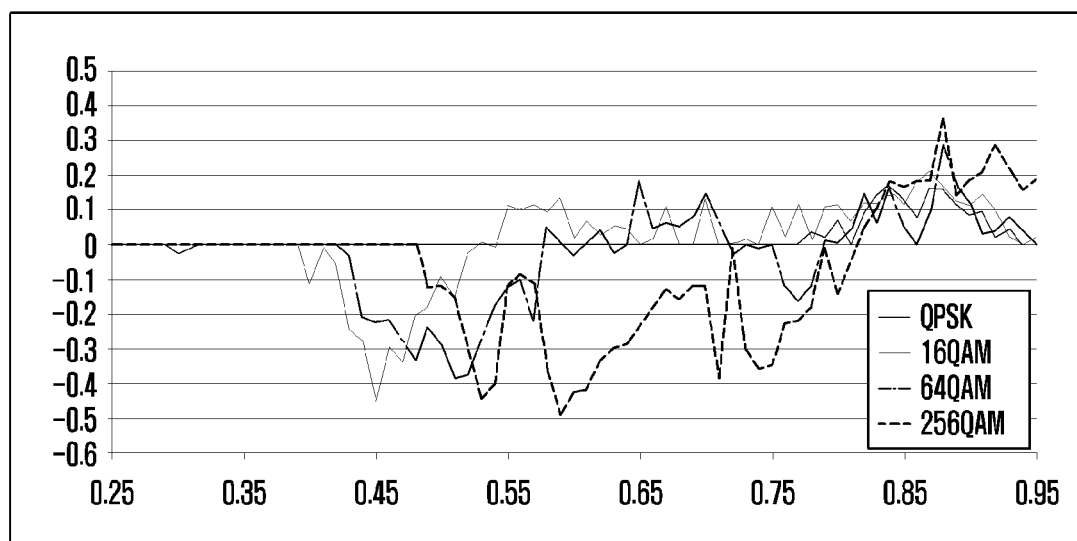
FIGS. 23A and 23B show SNR values satisfying a specific BLER during signal transmission according to the present disclosure.

In FIG. 23A, when the transmission start points are determined using set1 and set3, SNR differences satisfying BLER=0.01 are presented along with code rates and modulation schemes. As shown in FIG. 23A, BLER=0.01 can be satisfied at lower SNR values when different sets are used depending on the coding rate and modulation scheme.

For example, when the number of column blocks of the parity check matrix is 52 and the input bits related to two column blocks are always punctured and are not transmitted, the codeword bits ($N_{cb}$) are 50*Z, and the set indicating the positions of transmission start points can be defined as follows. Here, Z is the size of the circulant permutation matrix of the parity check matrix of the LDPC code. In the following description, the position of the transmission start point means the position from the remaining bits excluding those bits that are always punctured.

Set4={0, 13*Z, 25*Z, 38*Z}
Set5={0, 18*Z, 25*Z, 38*Z}

If (R>=0.62 and MOD=256 QAM) or (R>=0.62 and MOD=64QAM) or (R>=0.53 and MOD=16 QAM) or (R>=0.53 and MOD=QPSK) then starting positions set is set4
  else starting positions set is set5

Here, these sets may be represented by set4={0, 13, 25, 38} and set5={0, 18, 25, 38}.

As another example, when the number of column blocks in the parity check matrix is 52, at least one of the sets set1, set2, and set3 is used for all code rates and modulation schemes.

As another example, when the number of column blocks of the parity check matrix is 52 and the input bits related to two column blocks are always punctured and are not transmitted, the set representing the positions of the transmission start points indicated by the RV mode indicator may be {0, 11*Z, 16*Z, 25*Z}. This set may be represented by {0, 11, 16, 25}.

Figure 23B:
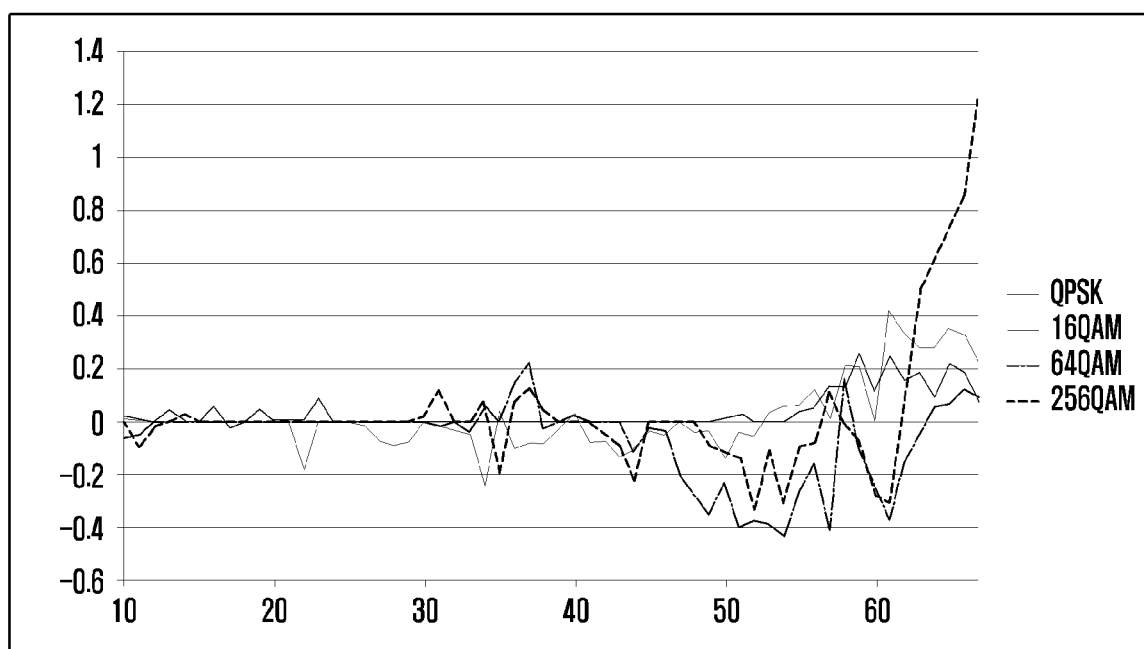

In FIG. 23B, when the transmission start points are determined using set4 and set5, SNR differences satisfying BLER=0.01 are presented along with code rates and modulation schemes. As shown in FIG. 23B, BLER=0.01 can be satisfied at lower SNR values when different sets are used depending on the coding rate and modulation scheme.

Z can be omitted when representing the set.

In the above embodiments, the code rate R may be preconfigured by higher layer signaling (RRC signaling), MAC CE, or downlink physical layer signal (L1 DL control), and it may also be computed directly by the transceiver. Or, R may be given in the MCS table. Or, R=f(k/E), which means that R is a function of k/E. Here, k is the number of information bits (the length of the information word of the LDPC code, the length of TBS, CBS or CBG bits plus CRC bits if necessary), and E is the number of codeword bits to be transmitted. The number of codeword bits to be transmitted (E) may be determined according to the frame structure in which the information bits are coded and transmitted, the number of layers, and the modulation scheme. The information word of the LDPC code is a bit string in which zero bits are padded to CB (or bit string including CRC in TB).

Next, a description is given of a method and apparatus for modulation symbol mapping during retransmission. When the codeword bits are received after being converted into the modulation symbols and being transmitted, the log likelihood ratio (LLR) of the bits may be high or low during decoding according to the positions of the bits constituting the modulation symbols to which the codeword bits have been mapped. If a bit at a position with a high LLR is continuously transmitted at the same position and a bit at a position with a low LLR is continuously transmitted at the same position during symbol modulation in the same manner, the probability that a bit with a low LLR continues to have a low LLR is high even if retransmission is performed. A method for solving this problem is described as follows.

Figure 14A:
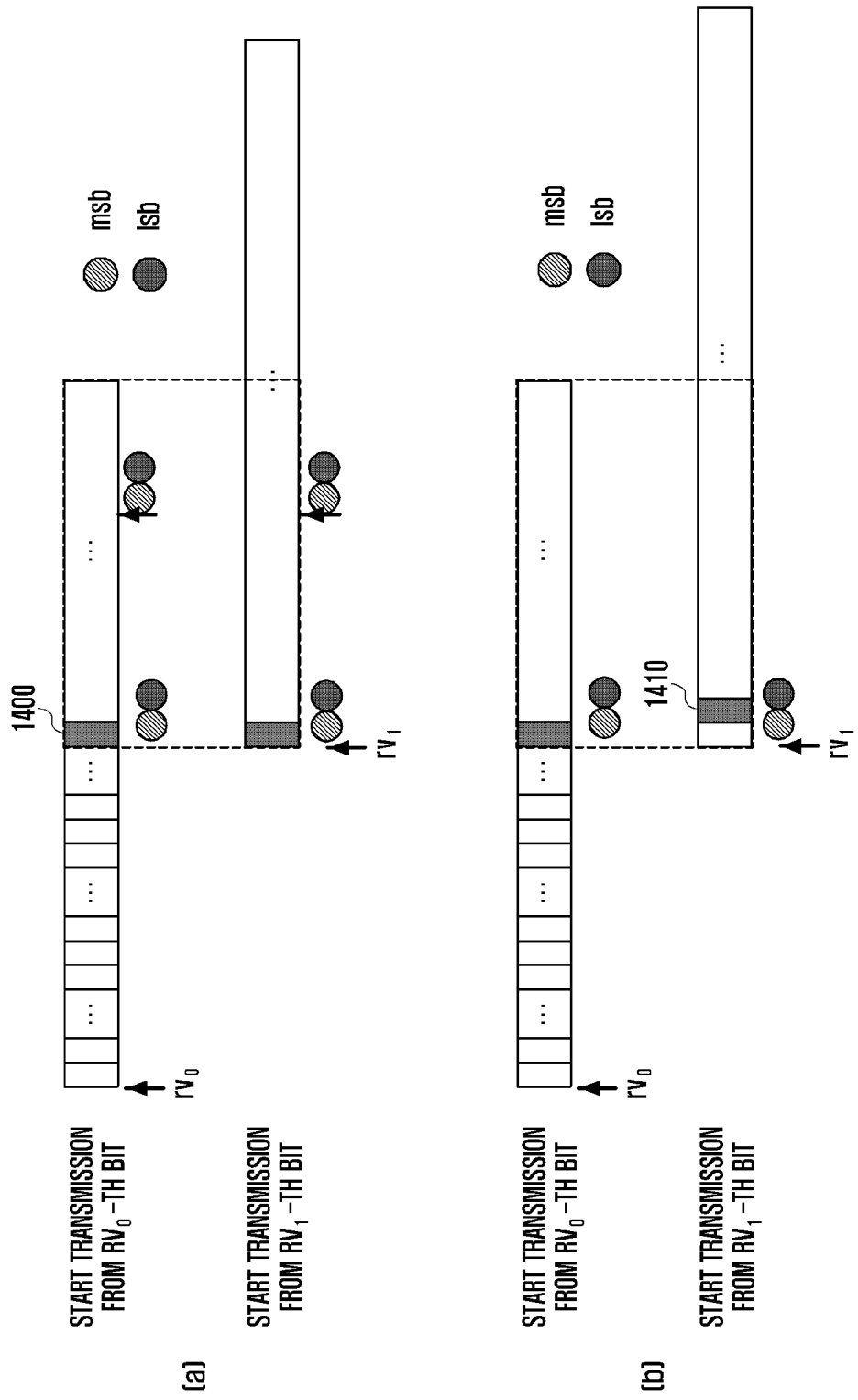
FIG. 14A illustrates modulation symbol mapping when the retransmitted symbols are the same.

FIG. 14A illustrates modulation symbol mapping when the same bits are transmitted at the same positions of the modulation symbol during retransmission. Part (a) of FIG. 14A shows that, when the retransmitted symbols are mapped in the same way, the bit at position (1400) is continuously mapped to the most significant bit (MSB) even if retransmission is performed. In the present disclosure, when codeword bits are modulated into symbols, if those bits corresponding to one symbol are shifted by $rv_{idx}$, the bit at position (1400) becomes the least significant bit (LSB) at position (1410). Since the LLRs of the MSB and the LSB are different in symbol modulation, the bit indicated by position (1400) and the bit next to it are transmitted with a high LLR or a low LLR at the initial transmission and retransmission, so that the performance can be even.

Figure 14B:
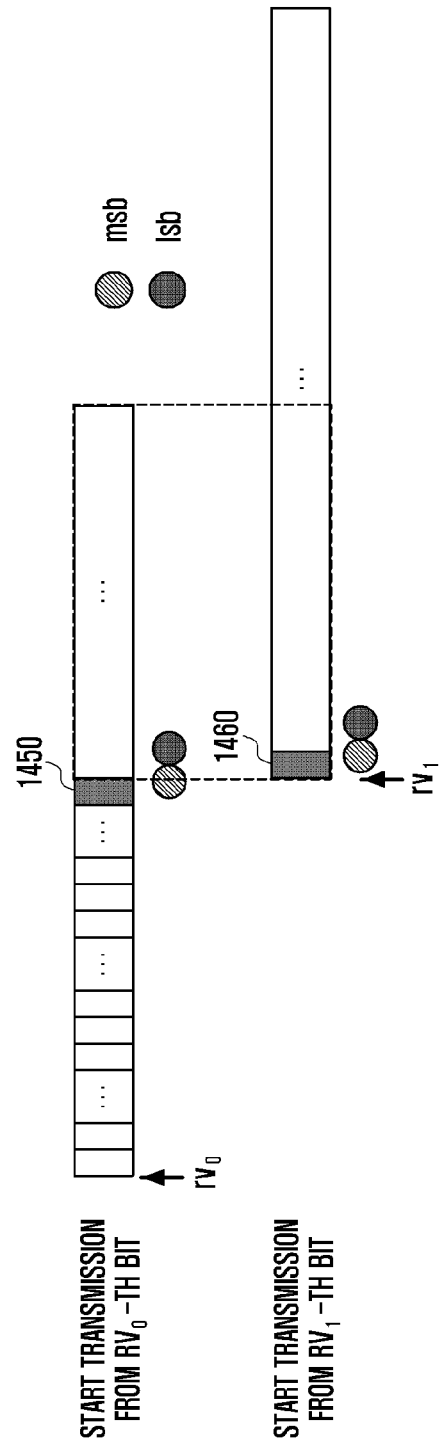
FIG. 14B illustrates modulation symbol mapping when the retransmitted symbols are not the same.

FIG. 14B illustrates modulation symbol mapping when the retransmitted symbols are not the same. When the bits constituting a modulation symbol mapped at retransmission are not the same, even if the bit at position (1450) is shifted by rv to position (1460), it can become the MSB as in the initial transmission. In this case, the bits may be shifted by one for each modulation symbol index without shifting by rv. Hence, not to perform modulation while determining whether the retransmitted symbols are the same or not, the transceiver preferably performs symbol modulation by applying both of the above two methods. Specifically, each symbol is cyclically shifted by the sum of the rv index and the symbol index.

Figure 15:
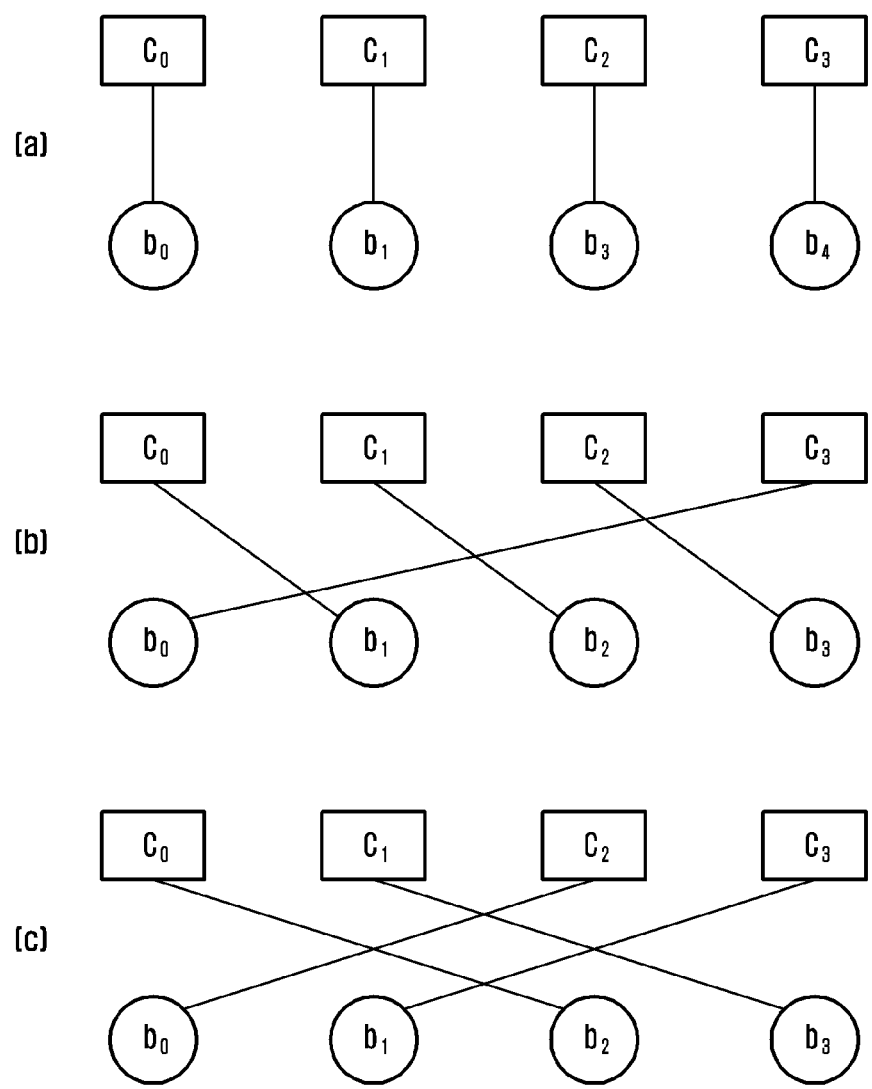
FIG. 15 illustrates a method of applying a cyclic shift to each symbol.

FIG. 15 illustrates applying a cyclic shift to each symbol. In part (a) where 16-QAM (quadrature amplitude modulation) is used and cyclic shifting is not applied, the codeword bits $C_0$, $C_1$, $C_2$ and $C_3$ are mapped in sequence to the bits $b_0$, $b_1$, $b_2$ and $b_3$ for symbol modulation. In part (b) where the sum of the rv index and the symbol index is 1, the codeword bits $C_0$, $C_1$, $C_2$ and $C_3$ are mapped in sequence to the bits $b_1$, $b_2$, $b_3$ and $b_0$ for symbol modulation. In part (c) where the sum of the rv index and the symbol index is 2, the codeword bits $C_0$, $C_1$, $C_2$ and $C_3$ are mapped in sequence to the bits $b_2$, $b_3$, $b_0$ and $b_1$ for symbol modulation.

Figure 16A:
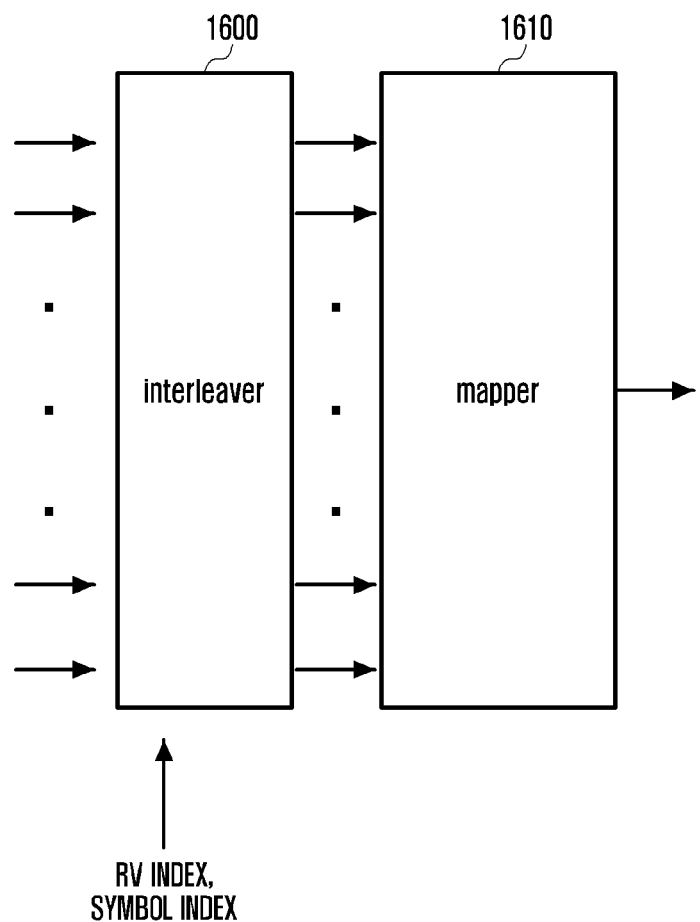
FIG. 16A illustrates a block diagram of an apparatus carrying out the present disclosure.

FIG. 16A illustrates a block diagram of an apparatus carrying out the present disclosure. In FIG. 16A, the interleaver 1600 may cyclically shift the bits based on the rv index and the symbol index, and the mapper 1610 may modulate the shifted bits into symbols.

Figure 16B:
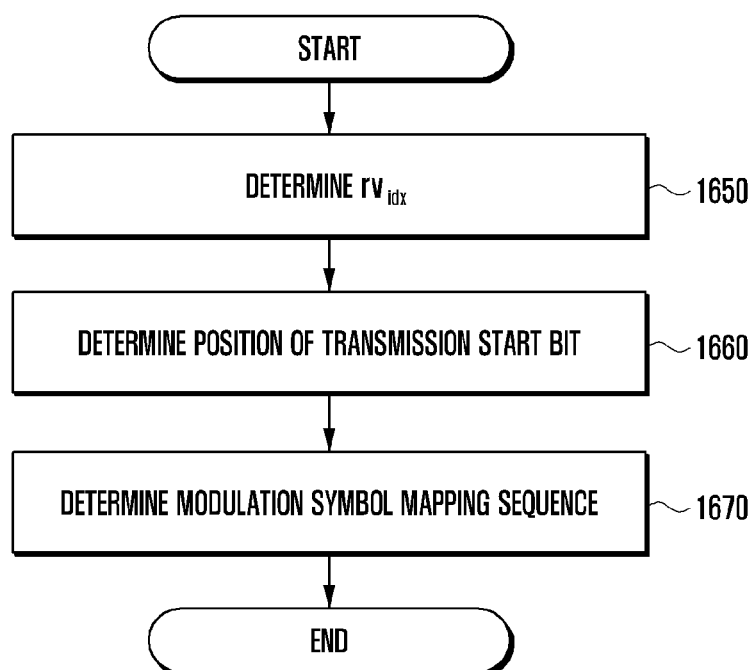
FIG. 16B illustrates a flowchart for modulation symbol mapping according to an embodiment of the present disclosure.

FIG. 16B illustrates a flowchart for modulation symbol mapping according to an embodiment of the present disclosure. With reference to FIG. 16B, the transmitter may determine the index of the redundancy version (RV) ($rv_{idx}$) at step 1650, and may determine the start position ($S_{idx}$ or $k_0$) of transmission at step 1660. Thereafter, the transmitter may determine the mapping sequence of bits for modulation symbols at step 1670, which is determined based on the rv index and the symbol index. The value of $rv_{idx}$ may be sent by signaling, may be determined according to a preset sequence, or may be determined by a method proposed in the present disclosure.

Figure 17:
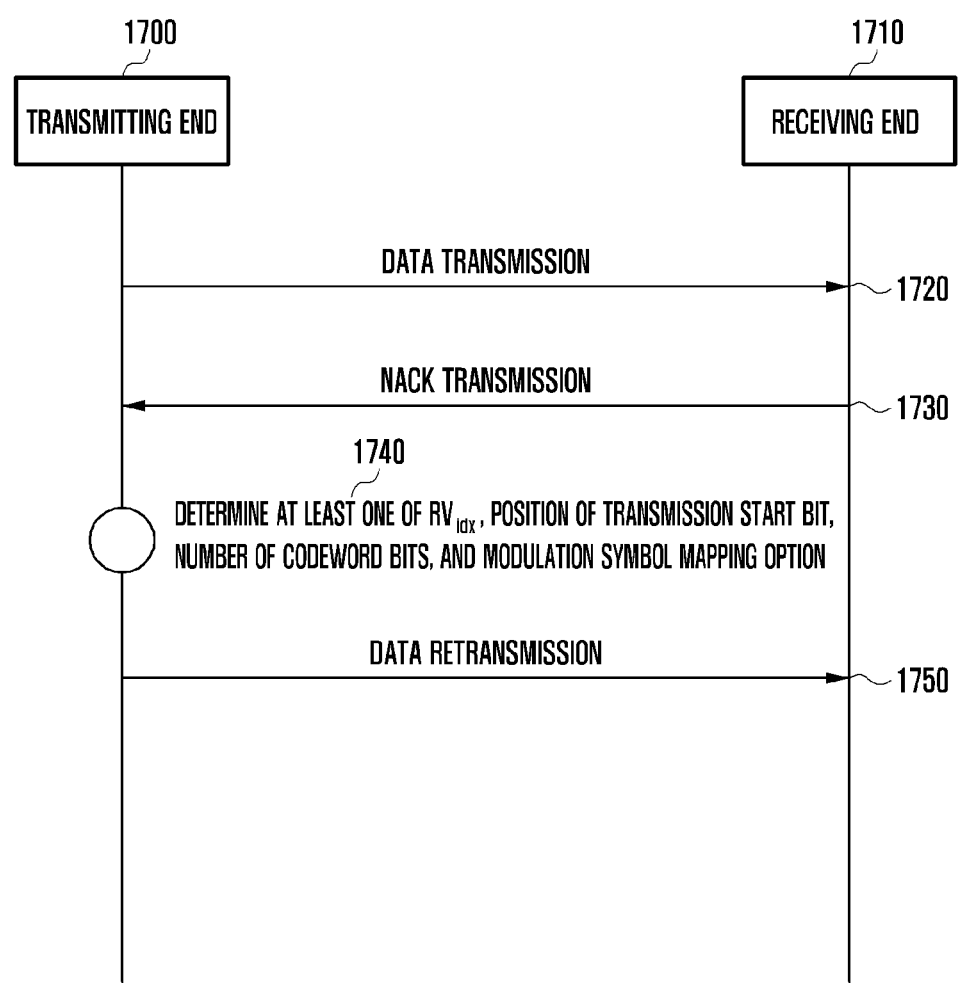
FIG. 17 is a sequence diagram illustrating data retransmission according to an embodiment of the present disclosure.

FIG. 17 is a sequence diagram illustrating data retransmission according to an embodiment of the present disclosure. With reference to FIG. 17, the transmitting end 1700 initially transmits the data to the receiving end 1710 (1720). Thereafter, the receiving end transmits a NACK (negative acknowledgment) indicating that data decoding has failed to the transmitting end (1730). Upon reception of a NACK, the transmitting end determines at least one of the rv value (rv index) for data retransmission, the position of the transmission start bit, the number of codeword bits, and the cyclic shift value for modulation symbol mapping for retransmission (1740). The transmitting end performs data retransmission based on the determination result (1750). At step 1740, at least one of the maximum number of transmitted bits and the maximum transmission rate may also be determined.

Next, a description is given of an embodiment where $rv_{idx}$ is used in accordance with a preset $rv_{idx}$ sequence when the parity check matrix is different.

To facilitate storing and presenting a plurality of parity check matrices, a parity check matrix group may be defined based on the number of information blocks ($K_b$) and the number of codeword blocks ($N_b$) as shown in FIG. 6B. That is, when there are parity check matrices using different circulant permutation matrix sizes (Z) and different exponent values of the circulant permutation matrixes, if the parity check matrices have the same information block count ($K_b$) and codeword block count ($N_b$), they belong to the same parity check matrix group. For example, based on $K_b$ and $N_b$, a first parity check matrix group (PCM group 1) and a second parity check matrix group (PCM group 2) can be specified as follows.

Here, when $rv_{idx}$ is transmitted in a preset sequence without separate signaling, different transmission sequences may be used according to the parity check matrix groups as Table 4.

TABLE 4

| | $K_b$ | $N_b$ | $Rv_{idx}$ order |
|---|---|---|---|
| First parity check matrix group | 22 | 68 | 0 2 1 3 |
| second parity check matrix group | 10 | 52 | 0 2 3 1 |

A description is given of another embodiment for the method and apparatus for modulation symbol mapping. A block interleaver may be present after the puncturing/repetition/zero-removal unit 442 in the rate matching unit 440 shown in FIG. 4.

Figure 24:
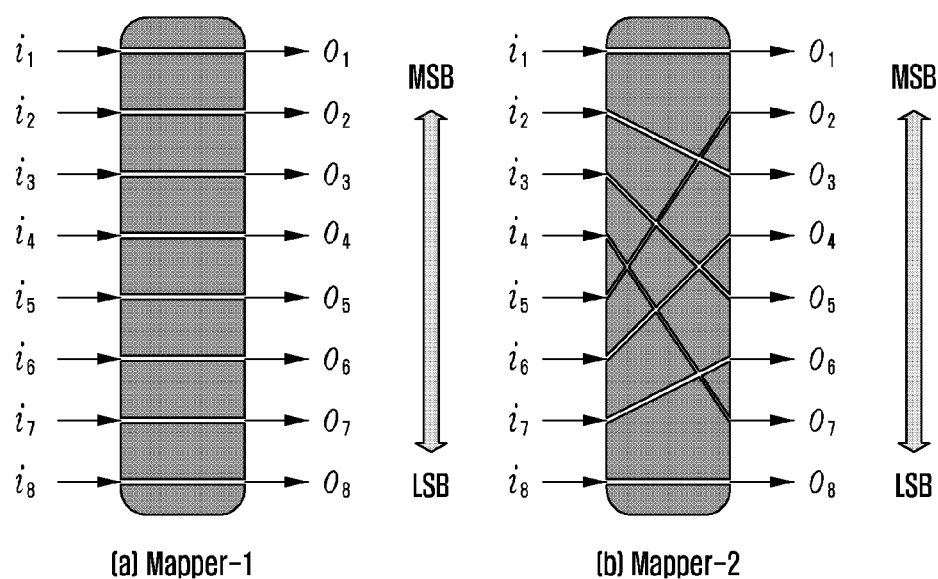
FIG. 24 depicts a block interleaver.

As shown in FIG. 4, the output bits of the rate matching unit 440 are input to the modulation unit 450. The modulation unit includes a mapper to map input bits to bits constituting modulation symbols. The mapping sequence may be different depending on $rv_{idx}$ and retransmission. For example, to transmit based on the same $rv_{idx}$ as that used in the previous transmission, mapping may be performed in the reverse order of the mapping sequence used for the previous transmission. More specifically, at least for $rv_{idx}$=0, mapping is performed in the reverse order of the mapping sequence used in the previous transmission with $rv_{idx}$=0. The case of 256-QAM is shown in FIG. 24. If $rv_{idx}$ is j at the $i^{th}$ transmission, mapper-1 is used to map bits to symbols, and mapper-2 is used for at least one case among the $i^{th}$ or later transmissions with $rv_{idx}$=j. In this case, performance improvement can be achieved based on different reliabilities of the bits constituting the modulation symbol.

When the mapping is changed if the same $rv_{idx}$ is repeated, it is better for performance enhancement to repeat the same $rv_{idx}$ during retransmission than using entirely different $rv_{idx}$ values.

When retransmission is performed according to the above method, in the LDPC encoding/decoding system based on the parity check matrix group with $(K_b, N_b)=(22, 68)$ or $(10, 52)$, the sequence $\{0, 2, 0, 3, 1\}$ may be utilized if retransmission is performed according to the preset $rv_{idx}$ sequence. Or, the preset $rv_{idx}$ sequence may be $\{0, 2, 0, 3\}$. Or the preset $rv_{idx}$ sequence may be $\{0, 2\}$.

The above sequence may be determined according to the following procedure.

Figure 25:
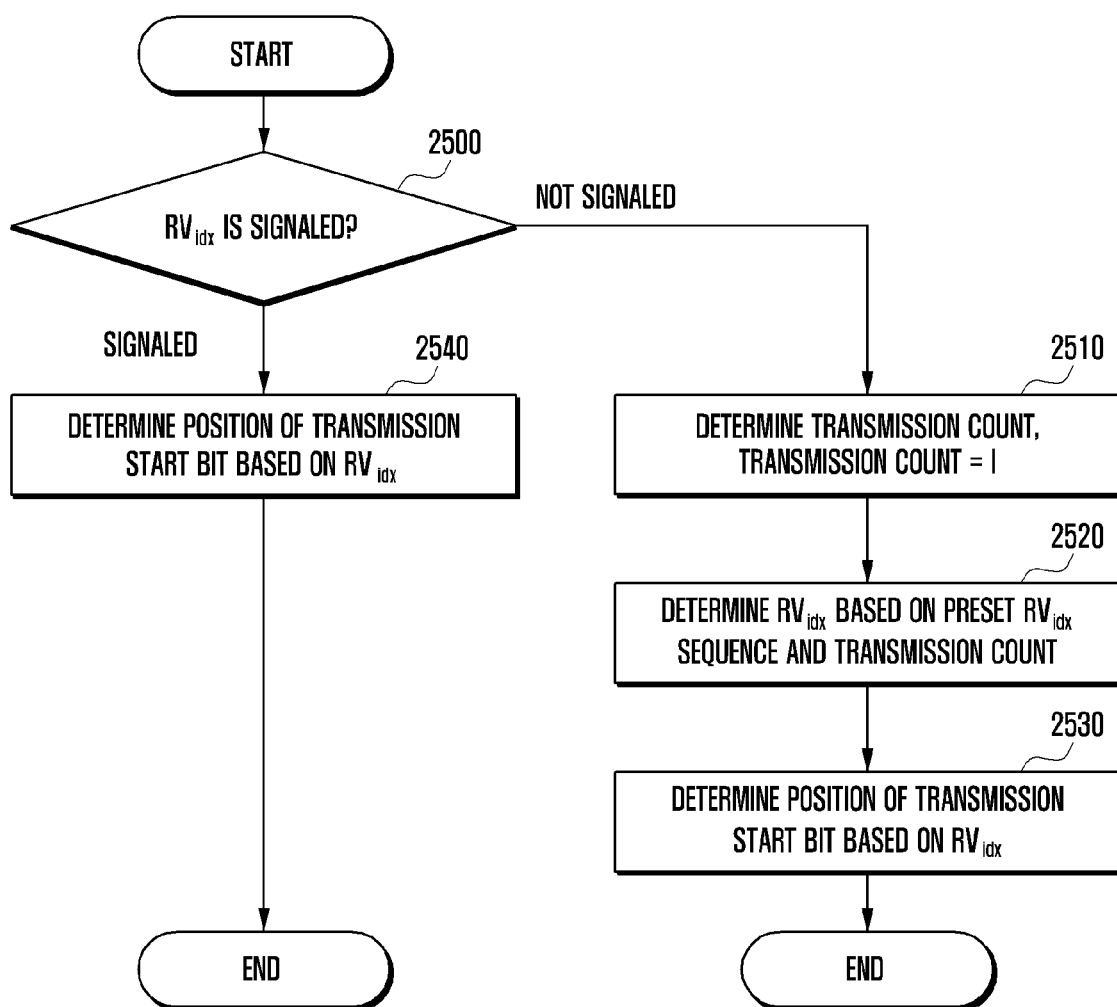
FIG. 25 is a flowchart illustrating the sequence of transmission according to the present disclosure.

1) Assume that $rv_{idx}$ is 0 at initial transmission.
2) For (0<i<N+1)
At $i^{th}$ transmission, determine $rv_{idx}$ with good performance in various modulation schemes and coding rates based on $rv_{idx}$ determined up to $(i-1)^{th}$ transmission.
3) End for A more detailed data transmission sequence is shown in FIG. 25.

First, the transmitter determines whether $rv_{idx}$ is signaled (2500). If $rv_{idx}$ is not signaled and $rv_{idx}$ is determined based on the preset sequence, the transmission count is determined (2510). If the number of elements in the $rv_{idx}$ order set is S and the transmission count is i, the value of i mod S in the $rv_{idx}$ order set is determined as $rv_{idx}$ (2520). Thereafter, the position of the transmission start bit is determined based on $rv_{idx}$ (2530).

If a parity check matrix belonging to the first parity check matrix group is used, the $rv_{idx}$ order may be $\{0, 2, 1, 3\}$.

If a parity check matrix belonging to the second parity check matrix group is used, the $rv_{idx}$ order may be $\{0, 2, 3, 1\}$.

If reverse mapping is used at least once for the same $rv_{idx}$, the $rv_{idx}$ order may be $\{0, 2, 0, 3, 1\}$. If (i mod 5)=2 for transmission count=i, the codeword bits are mapped to the modulation symbol in the reverse order of the mapping sequence used at (i mod 5)=0.

Or, the $rv_{idx}$ order may be $\{0, 2, 0, 3\}$. If (i mod 4)=2 for transmission count=i, the codeword bits are mapped to the modulation symbol in the reverse order of the mapping sequence used at the $i^{th}$ transmission satisfying (i mod 4)=0.

Or, the $rv_{idx}$ order may be $\{0, 2\}$. If (i mod 4)=2 for transmission count=i, the codeword bits are mapped to the modulation symbol in the reverse order of the mapping sequence used at the $i^{th}$ transmission satisfying (i mod 4)=0. In addition, if (i mod 4)=3, the codeword bits are mapped to the modulation symbol in the reverse order of the mapping sequence used at the $i^{th}$ transmission satisfying (i mod 4)=1.

If $rv_{idx}$ is signaled, the transmitter determines the position of the transmission start bit based on $rv_{idx}$ (2540).

Although the present disclosure has been described with respect to data retransmission, it is evident that it can be applied not only to data but also to all signals transmitted between the base station and the terminal. In addition, the transmitting end and the receiving end of FIG. 17 may be at least one of the base station and the terminal.

Figure 18:
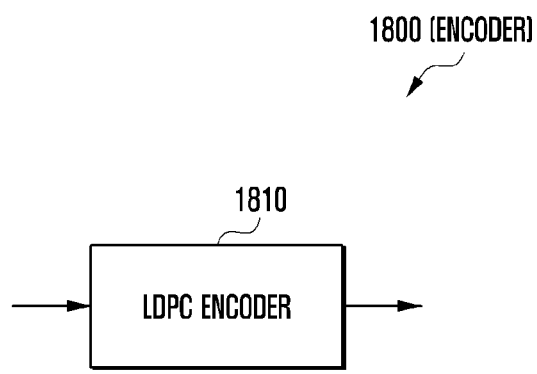
FIG. 18 illustrates a block diagram of an encoder according to an embodiment of the present disclosure.

FIG. 18 illustrates a block diagram of an encoder according to an embodiment of the present disclosure. The encoder 1800 may perform LDPC encoding.

In FIG. 18, the encoder 1800 may include an LDPC encoder 1810. The LDPC encoder 1810 may generate LDPC codewords by performing LDPC encoding on the input bits based on the parity check matrix. The $K_{ldpc}$ bits may constitute $K_{ldpc}$ LDPC information bits $I=(i_0, i_1, \ldots, i_{K_{ldpc}-1})$ for the LDPC encoder 1810. The LDPC encoder 1810 may performing systematic LDPC encoding on the $K_{ldpc}$ LDPC information bits to generate an $N_{ldpc}$-bit LDPC codeword $\Lambda=(c_0, c_1, \ldots, c_{N_{ldpc}-1})=(i_0, i_1, \ldots, i_{K_{ldpc}-1}, p_0, p_1, \ldots, p_{N_{ldpc}-K_{ldpc}-1})$. This generation process includes) determining a codeword so that the product of the LDPC codeword and the parity check matrix becomes a zero vector as described in Equation 1. The parity check matrix of the present disclosure may have the same layout as the parity check matrix shown in FIG. 3.

In this case, the LDPC encoder 1810 can perform LDPC encoding using a parity check matrix defined differently according to the code rate (i.e., code rate of the LDPC code).

Since LDPC coding has already been described above, a repeated description thereof is omitted.

Meanwhile, the encoder 1800 may further include a memory (not shown) to pre-store information on the code rate, codeword length, and parity check matrix of the LDPC code. The LDPC encoder 1810 may use this information to perform LDPC encoding. The information on the parity check matrix may include information on the exponent value of the circulant matrix when the parity matrix proposed in the present disclosure is used.

Next, a description is given of receiver operation with reference to FIG. 5.

The demodulation unit 510 of the receiver 500 demodulates a signal received from the transmitter 400.

Specifically, the demodulation unit 510 is a component corresponding to the modulation unit 450 of the transmitter 400 of FIG. 4, and it may demodulate a signal received from the transmitter 400 to generate values corresponding to the bits transmitted from the transmitter 400.

To this end, the receiver 500 may pre-store information about the modulation scheme based on the mode used by the transmitter 400. Hence, the demodulation unit 510 may demodulate a signal received from the transmitter 400 according to the mode, and generate values corresponding to the LDPC codeword bits.

Here, the values corresponding to the bits transmitted by the transmitter 400 may be log likelihood ratio (LLR) values. Specifically, the LLR value can be a value obtained by taking the logarithm of the ratio between the probability that the transmitted bit is 0 and the probability that the transmitted bit is 1. The LLR value can also be a bit value. The LLR value may be a representative value determined according to the interval to which the probability that the bit transmitted from the transmitter 400 is 0 or 1 belongs.

The demodulation unit 510 may include a mux (not shown) to multiplex the LLR values. Specifically, the mux is a component corresponding to a bit demux (not shown) of the transmitter, and can perform an operation corresponding to the bit demux.

To this end, the receiver 500 may pre-store information on the parameters used by the transmitter 400 for demultiplexing and block interleaving. Hence, the mux may multiplex the LLR values corresponding to the cell word in units of bits by performing the inverse operation of demultiplexing and block interleaving performed by the bit demux.

The rate de-matching unit 520 may insert an LLR value into the LLR values output from the demodulation unit 510. The rate de-matching unit 520 may insert preset LLR values between the LLR values output from the demodulation unit 510.

The rate de-matching unit 520 is a component corresponding to the rate matching unit 440 of the transmitter 400, and it may perform an operation corresponding to the interleaver 441 and the puncturing/repetition/zero-removal unit 442.

The rate de-matching unit 520 performs deinterleaving corresponding to the interleaver 441 of the transmitter. The LLR inserter 522 may insert LLR values corresponding to zero bits into the deinterleaved result at the position where zero bits are padded in the LDPC codeword. The LLR value corresponding to padded zero bits, i.e. shortened zero bits, may be $\infty$ or $-\infty$. However, $\infty$ or $-\infty$ is a theoretical value, and may be the maximum or minimum of the LLR values used in the receiver 500.

To this end, the receiver 500 may pre-store information on the parameters used by the transmitter 400 for padding zero bits. Hence, the rate de-matching unit 520 may determine the position where zero bits are padded in the LDPC codeword and insert an LLR value corresponding to the shortened zero bits at the position.

The LLR inserter 522 of the rate de-matching unit 520 may insert an LLR value corresponding to the punctured bits at the position where bits are punctured in the LDPC codeword. Here, the LLR value corresponding to the punctured bits may be zero.

To this end, the receiver 500 may pre-store information on the parameters used by the transmitter 400 for puncturing. Hence, the LLR inserter 522 may insert an LLR value corresponding to the punctured bits at the position where the LDPC parity bits are punctured.

The LLR combiner 523 may combine (or add) the LLR values output from the LLR inserter 522 and the demodulation unit 510. Specifically, the LLR combiner 523 is a component corresponding to the puncturing/repetition/zero-removal unit 442 of the transmitter 400, and it may perform an operation corresponding to repetition. The LLR combiner 523 may combine the LLR value corresponding to the repeated bits with a different LLR value. Here, the different LLR value may correspond to the LDPC parity bits that are selected, as a basis for generating the repeated bits, by the transmitter 400 for repetition.

That is, as described above, the transmitter 400 may select bits from the LDPC parity bits, repeat the selected bits between the LDPC information bits and the LDPC parity bits, and transmit the result to the receiver 500.

The LLR values for the LDPC parity bits may include the LLR values for the repeated LDPC parity bits and the LLR values for the unrepeated LDPC parity bits (i.e., LLR values for the LDPC parity bits generated by encoding). Hence, the LLR combiner 523 may combine the LLR values for the same LDPC parity bits.

To this end, the receiver 500 may pre-store information on the parameters used by the transmitter 400 for repetition. Hence, the LLR combiner 523 can determine the LLR value for the repeated LDPC parity bits and combine it with the LLR value for the LDPC parity bits on which the repetition is based.

The LLR combiner 523 may combine the LLR value corresponding to the retransmitted or IR (incremental redundancy) bits with a different LLR value. Here, the different LLR value may correspond to the bits selected by the transmitter 400 for generating LDPC codeword bits as a basis for generating the retransmitted or IR bits.

As described above, for HARQ, when a NACK is received, the transmitter 400 may transmit some or all of the codeword bits to the receiver 500.

Hence, the LLR combiner 523 may combine the LLR value for the bits received via retransmission or IR with the LLR value for the LDPC codeword bits received during the previous frame.

To this end, the receiver 500 may pre-store information on the parameters used by the transmitter 400 for generating the retransmitted or IR bits. Hence, the LLR combiner 523 can determine the LLR value for the retransmitted or IR bits and combine it with the LLR value for the LDPC parity bits serving as a basis for generating the retransmitted bits.

The deinterleaver 524 can perform deinterleaving on the LLR values output from the LLR combiner 523.

Specifically, the deinterleaver 524 is a component corresponding to the interleaver 441 of the transmitter 400, and it can perform an operation corresponding to the interleaver 441.

To this end, the receiver 500 may pre-store information on the parameters used by the transmitter 400 for interleaving. Hence, the deinterleaver 524 may deinterleave the LLR values corresponding to the LDPC codeword bits by performing the inverse operation of interleaving performed by the interleaver 441.

The LDPC decoder 530 may perform LDPC decoding based on the LLR values output from the rate de-matching unit 520.

Specifically, the LDPC decoder 530 is a component corresponding to the LDPC encoder 430 of the transmitter 400, and it can perform an operation corresponding to the LDPC encoder 430.

To this end, the receiver 500 may pre-store information on the parameters used by the transmitter 400 for LDPC encoding according to the mode. Hence, the LDPC decoder 530 may perform LDPC decoding according to the mode based on the LLR values output from the rate de-matching unit 520.

For example, the LDPC decoder 530 may perform LDPC decoding on the LLR values output from the rate de-matching unit 520 using an iterative decoding scheme based on the sum-product algorithm, and output error-corrected bits based on LDPC decoding.

The zero removal unit 540 may remove zero bits from the bits output from the LDPC decoder 530.

Specifically, the zero removal unit 540 is a component corresponding to the zero padding unit 420 of the transmitter 400, and it can perform an operation corresponding to the zero padding unit 420.

To this end, the receiver 500 may pre-store information on the parameters used by the transmitter 400 for padding zero bits. Hence, the zero removal unit 540 may remove the zero bits padded by the zero padding unit 420 from the bits output from the LDPC decoder 530.

The de-segmentation unit 550 is a component corresponding to the segmentation unit 410 of the transmitter 400, and it can perform an operation corresponding to the segmentation unit 410.

To this end, the receiver 500 may pre-store information on the parameters used by the transmitter 400 for segmentation. Hence, the de-segmentation unit 550 may combine the bits output from the zero removal unit 540, i.e., segments for the variable length input bits, to recover the bits before segmentation.

Figure 19:
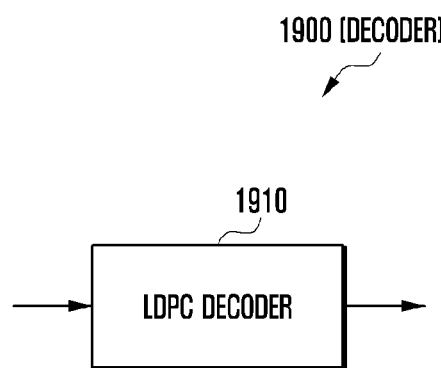
FIG. 19 illustrates a block diagram of a decoder according to an embodiment of the present disclosure.

FIG. 19 illustrates a block diagram of a decoder according to an embodiment of the present disclosure. With reference to FIG. 19, the decoder 1900 may include an LDPC decoder 1910. The decoder 1900 may further include a memory (not shown) to store information regarding the code rate, the codeword length, and the parity check matrix of the LDPC code, and the LDPC decoder 1910 can perform LDPC decoding using this information. However, this is only an example, and such information may be provided from the transmitting end.

The LDPC decoder 1910 performs LDPC decoding on the LDPC codeword based on the parity check matrix.

For example, the LDPC decoder 1910 can perform LDPC decoding to recover information bits by computing LLR (log likelihood ratio) values corresponding to LDPC codeword bits through an iterative decoding algorithm.

Here, the LLR value is a channel value corresponding to the LDPC codeword bits, and can be represented in various ways.

For example, the LLR value can be a value obtained by taking the logarithm of the ratio between the probability that the bit transmitted by the transmitter through the channel is 0 and the probability that the transmitted bit is 1. The LLR value can be a bit value according to a hard decision. The LLR value can be a representative value determined according to the interval to which the probability that the bit transmitted from the transmitter is 0 or 1 belongs.

In this case, the transmitting end can generate the LDPC codeword using the LDPC encoder 1810 as shown in FIG. 18.

Meanwhile, the parity check matrix used in LDPC decoding may have the same type as the parity check matrix shown in FIG. 3.

In this case, the LDPC decoder 1910 can perform LDPC decoding using different parity check matrices according to the code rate (i.e., the code rate of the LDPC code).

Figure 20:
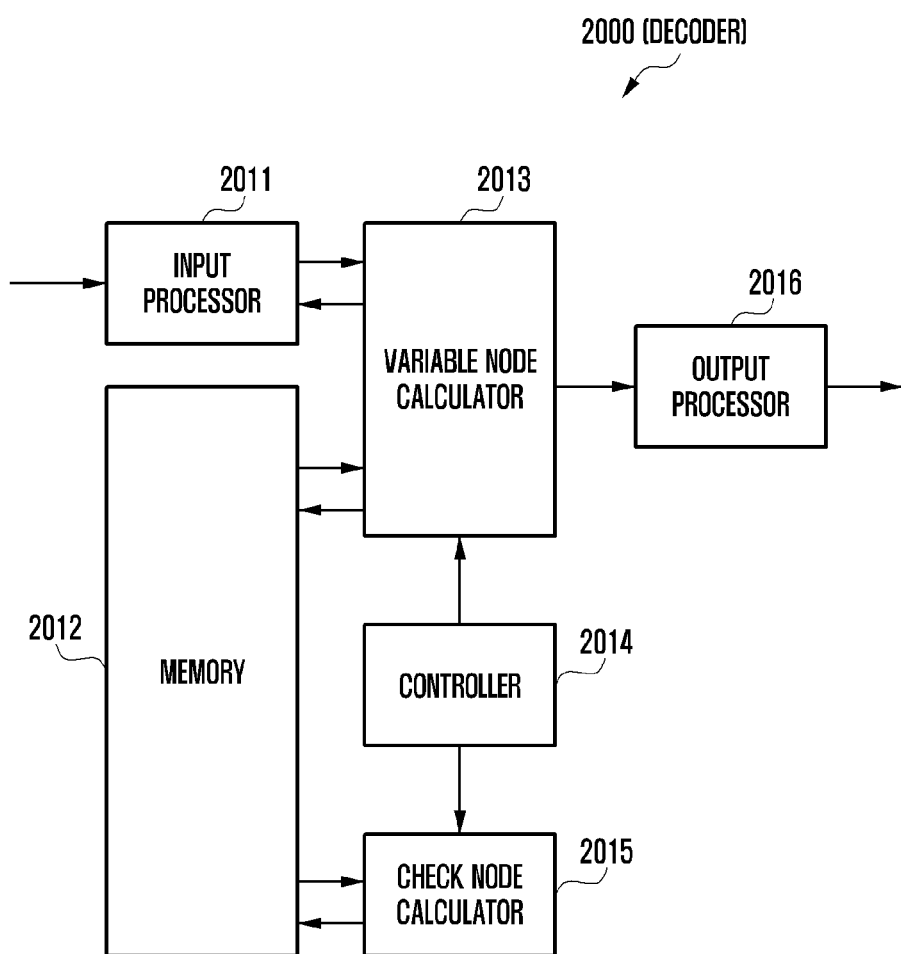
FIG. 20 illustrates a block diagram of a decoder according to an embodiment of the present disclosure.

Meanwhile, as described above, the LDPC decoder 1910 can perform LDPC decoding using an iterative decoding algorithm. In this case, the LDPC decoder 1910 can be configured as shown in FIG. 20. As the iterative decoding algorithm is already known, the configuration shown in FIG. 20 is only an example.

FIG. 20 illustrates a block diagram of an LDPC decoder according to another embodiment of the present disclosure. In FIG. 20, the decoder 2000 may include an input processor 2011, a memory 2012, a variable node calculator 2013, a controller 2014, a check node calculator 2015, and an output processor 2016.

The input processor 2011 may store input values. Specifically, the input processor 2011 may store the LLR values of a signal received through the radio channel.

The controller 2014, based on the parity check matrix corresponding to the block size (i.e., codeword length) and the code rate of the signal received via the radio channel, may determine the number of values input to the variable node calculator 2013 and the corresponding address of the memory 2012 and determine the number of values input to the check node calculator 2015 and the corresponding address of the memory 2012.

The memory 2012 may store input data and output data of the variable node calculator 2013 and the check node calculator 2015.

The variable node calculator 2013 receives data elements from the memory 2012 according to information on the address and quantity of the input data from the controller 2014 and performs variable node operations. Then, the variable node calculator 2013 stores the results of variable node operations in the memory 2012 according to information on the address and quantity of the output data from the controller 2014. The variable node calculator 2013 outputs the results of variable node operations to the output processor 2016 based on the data input from the input processor 2011 and the memory 2012. The variable node operation is described before with reference to FIG. 18.

The check node calculator 2015 receives the data from the memory 2012 according to information on the address and quantity of the input data from the controller 2014, and performs check node operations. Then, the check node calculator 2015 stores the results of check node operations in the memory 2012 according to information on the address and quantity of the output data from the controller 2014. The check node operation is described before with reference to FIGS. 7A and 7B.

The output processor 2016 makes a hard decision on whether the information bits of the codeword from the transmitting end are 0 or 1 based on the data received from the variable node calculator 2013, and outputs the hard decision result, which becomes the final decoded value. In FIGS. 7A and 7B, it is possible to make a hard decision based on the sum of all message values input to one variable node (initial message value and all message values input from the check nodes).

Figure 21:
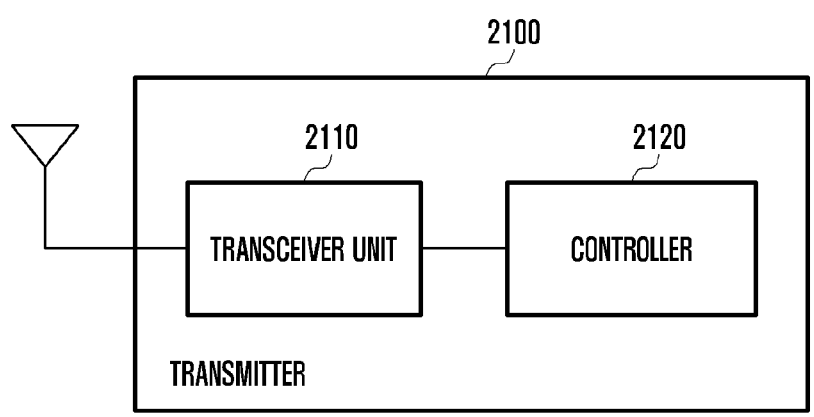
FIGS. 21 and 22 illustrate block diagrams of a transmitter and a receiver that may operate in accordance with embodiments of the present disclosure.
Figure 22:
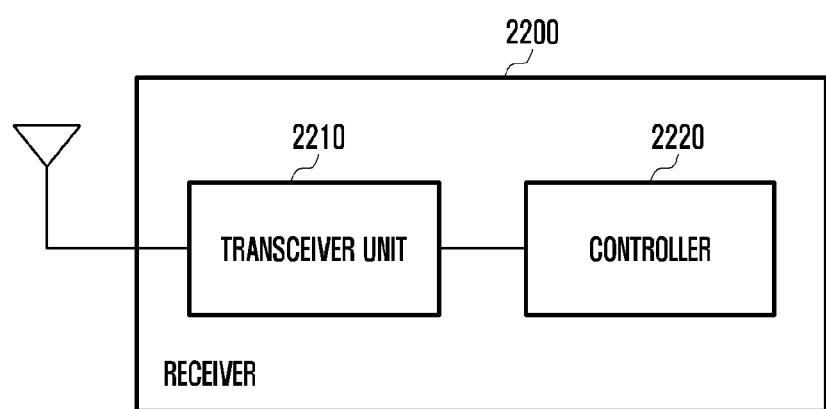

FIGS. 21 and 22 illustrate block diagrams of a transmitter and a receiver that may operate in accordance with embodiments of the present disclosure. Each of the transmitter and the receiver may be a base station or a terminal. With reference to FIG. 21, the transmitter 2100 may include a transceiver unit 2110 and a controller 2120. The transceiver unit 2110 transmits and receives information, signals, and messages to and from the receiver. The controller 2120 may control the transceiver unit 2110 to perform the transmission/reception operations, and it can also control carrying out embodiments of the present disclosure. The transmitter 400 of the present disclosure may or may not be included in the controller 2120. The encoder 1800 may or may not be included in the controller 2120.

With reference to FIG. 22, the receiver 2200 may include a transceiver unit 2210 and a controller 2220. The transceiver unit 2210 transmits and receives information, signals, and messages to and from the transmitter. The controller 2220 may control the transceiver unit 2210 to perform the transmission/reception operations, and it can also control carrying out embodiments of the present disclosure. The receiver 500 of the present disclosure may or may not be included in the controller 2220. The decoder 1900 may or may not be included in the controller 2220.

Although the present disclosure has been described with various embodiments, various changes and modifications may be suggested to one skilled in the art. It is intended that the present disclosure encompass such changes and modifications as fall within the scope of the appended claims.

What is claimed is:

1. A method performed by a transmitter in a communication system, the method comprising:
   identifying information bits to be transmitted, a redundancy version (RV) index for transmitting the information bits, and a parity check matrix group for a low density parity check (LDPC) coding;
   performing a segmentation of the information bits to at least one code block;
   identifying Z, a size of an identity matrix;
   encoding a code block by performing the LDPC coding based on a parity check matrix according to the identified parity check matrix group and the Z; and
   generating a bit sequence by performing a rate matching on at least a part of the encoded code block based on a starting position, which is a specific bit among plural bits of the encoded code block, wherein the rate matching comprises reordering at least the part of the encoded code block to be started from the starting position, and wherein the starting position is determined based on the RV index, the identified parity check matrix group, and the Z.

2. The method of claim 1, wherein an index of the starting position is a multiple of the Z.

3. The method of claim 1, wherein each of starting positions corresponds to one of a plurality of RV indices, and a first interval between a first starting position and a second starting position is different from a second interval between the second starting position and a third starting position, wherein the first starting position, the second starting position and the third starting position are consecutive starting positions.

4. The method of claim 1, wherein the rate matching comprises an interleaving of plural bits of at least the part of the encoded code block.

5. A method performed by a receiver in a communication system, the method comprising:

receiving, from a transmitter, a signal corresponding to a bit sequence;

performing a demodulation of the received signal to identifying a plurality of values corresponding to the bit sequence;

identifying a parity check matrix group for a low density parity check (LDPC) coding, Z, a size of an identity matrix, and a redundancy version (RV) index applied to the bit sequence; and identifying information bits by performing an LDPC decoding on the plurality of values based on a parity check matrix according to the identified parity check matrix group and the Z, wherein the bit sequence includes reordered at least a part of encoded information bits to be started from a starting position among a plurality of starting positions, and wherein the starting position is determined based on the RV index, the identified parity check matrix group, and the Z.

6. The method of claim 5, wherein an index of the starting position is a multiple of the Z.

7. The method of claim 5, wherein each of the plurality of starting positions corresponds to one of a plurality of RV indices, and a first interval between a first starting position and a second starting position is different from a second interval between the second starting position and a third starting position, wherein the first starting position, the second starting position and the third starting position are consecutive starting positions.

8. The method of claim 5, wherein identifying the information bits further comprises:

performing a rate de-matching based on the plurality of values.

9. A transmitter in a communication system, the transmitter comprising:

a transceiver; and a controller coupled with the transceiver and configured to:

identify information bits to be transmitted, a redundancy version (RV) index for transmitting the information bits, and a parity check matrix group for a low density parity check (LDPC) coding, perform a segmentation of the information bits to at least one code block, identify Z, a size of an identity matrix, encode a code block by performing the LDPC coding based on a parity check matrix according to the identified parity check matrix group and the Z, and generate a bit sequence by performing a rate matching on at least a part of the encoded code block based on a starting position, which is a specific bit among plural bits of the encoded code block, wherein the rate matching comprises reordering at least the part of the encoded code block to be started from the starting position, and wherein the starting position is determined based on the RV index, the identified parity check matrix group, and the Z.

10. The transmitter of claim 9, wherein an index of the starting position is a multiple of the Z.

11. The transmitter of claim 9, wherein each of starting positions corresponds to one of a plurality of RV indices, and a first interval between a first starting position and a second starting position is different from a second interval between the second starting position and a third starting position, wherein the first starting position, the second starting position and the third starting position are consecutive starting positions.

12. The transmitter of claim 9, wherein the rate matching comprises an interleaving of plural bits of at least the part of the encoded code block.

13. A receiver in a communication system, the receiver comprising:

a transceiver; and a controller coupled with the transceiver and configured to:

receive, from a transmitter, a signal corresponding to a bit sequence, perform a demodulation of the received signal to identifying a plurality of values corresponding to the bit sequence, identify a parity check matrix group for a low density parity check (LDPC) coding, Z, a size of an identity matrix, and a redundancy version (RV) index applied to the bit sequence, and identify information bits by performing an LDPC decoding on the plurality of values based on a parity check matrix according to the identified parity check matrix group and the Z, wherein the bit sequence includes reordered at least a part of encoded information bits to be started from a starting position among a plurality of starting positions, and wherein the starting position is determined based on the RV index, the identified parity check matrix group, and the Z.

14. The receiver of claim 13, wherein an index of the starting position is a multiple of the Z.

15. The receiver of claim 13, wherein each of the plurality of starting positions corresponds to one of a plurality of RV indices, and a first interval between a first starting position and a second starting position is different from a second interval between the second starting position and a third starting position, wherein the first starting position, the second starting position and the third starting position are consecutive starting positions.

16. The receiver of claim 13, wherein to identify the information bits, the controller is further configured to perform a rate de-matching based on the plurality of values.

* * * * *